(12) United States Patent
Sheflin et al.

(10) Patent No.: US 11,900,588 B2
(45) Date of Patent: Feb. 13, 2024

(54) IMAGE BASED LEARNING CORRECTION FOR MITIGATING THERMAL GHOSTING IN A DIGITAL PRINTER

(71) Applicant: Xerox Corporation, Norwalk, CT (US)

(72) Inventors: Joseph C. Sheflin, Macedon, NY (US);
Jack T. Lestrange, Macedon, NY (US);
Palghat S. Ramesh, Pittsford, NY (US)

(73) Assignee: Xerox Corporation, Norwalk, CT (US)

( * ) Notice: Subject to any disclaimer, the term of this patent is extended or adjusted under 35 U.S.C. 154(b) by 456 days.

(21) Appl. No.: 17/336,729

(22) Filed: Jun. 2, 2021

(65) Prior Publication Data
US 2022/0392039 A1 Dec. 8, 2022

(51) Int. Cl.
*G06T 7/00* (2017.01)
*G03F 7/00* (2006.01)
*G01J 5/00* (2022.01)

(52) U.S. Cl.
CPC ............. *G06T 7/001* (2013.01); *G01J 5/00* (2013.01); *G03F 7/7085* (2013.01); *G03F 7/70516* (2013.01); *G01J 2005/0077* (2013.01); *G06T 2207/20081* (2013.01); *G06T 2207/20084* (2013.01); *G06T 2207/30144* (2013.01)

(58) Field of Classification Search
CPC ........... G06T 7/001; G06T 2207/20081; G06T 2207/20084; G06T 2207/30144; G01J 5/00; G01J 2005/0077; G01J 5/485; G03F 7/70516; G03F 7/7085; B41F 13/22; B41F 23/0409; B41F 33/0054; B41F 33/16; B41F 35/02; B41F 23/0476; B41F 23/0479; B41F 7/26; B41P 2235/23; B41P 2227/70
See application file for complete search history.

(56) References Cited

U.S. PATENT DOCUMENTS 11,148,414 B1 * 10/2021 Lestrange ............ B41J 2/04586
2012/0103212 A1   5/2012 Stowe et al.
2012/0103221 A1   5/2012 Stowe et al.
(Continued)

OTHER PUBLICATIONS

Co-pending U.S. Appl. No. 17/137,473, filed Dec. 30, 2020.
(Continued)

*Primary Examiner* — Roy M Punnoose
(74) *Attorney, Agent, or Firm* — Caesar Rivise, PC

(57) ABSTRACT

An image based correction system compensates for the image quality artifacts induced by thermal ghosting on evolving imaging member surfaces. With thermal ghosting directly tied to previous image content, a feed forward system determines thermal ghosting artifacts based on images previously rendered and generates an open loop gray-level correction to a current image that mitigates undesirable ghosting. For example, the correction system compensates for the thermal ghosting by making the current image "lighter" in areas that will be imaged onto warmer blanket regions, thereby cancelling out TRC differences between different temperature regions. A temperature sensor is used to measure the temperature of the imaging blanket due to the stresses induced by the image. This data is used to learn the parameters of the temperature model periodically during operation, and used in subsequent corrections to mitigate thermal ghosting in spite of changes in blanket properties over use and time.

20 Claims, 16 Drawing Sheets

(56) References Cited

U.S. PATENT DOCUMENTS

| | | | |
|---|---|---|---|
| 2021/0402754 A1* | 12/2021 | Sheflin | B41J 2/0057 |
| 2021/0402755 A1* | 12/2021 | Frachioni | B41J 2/0057 |
| 2021/0402756 A1* | 12/2021 | Hirsch | B41M 1/06 |
| 2021/0402821 A1* | 12/2021 | Craig | B41F 33/0054 |
| 2021/0409021 A1* | 12/2021 | Ferrara, Jr. | B41J 2/0057 |
| 2022/0203749 A1* | 6/2022 | Herrmann | B41F 7/04 |
| 2022/0205778 A1* | 6/2022 | Liu | G01B 11/0675 |
| 2022/0219445 A1* | 7/2022 | Condello | G03G 15/10 |

OTHER PUBLICATIONS

Co-pending U.S. Appl. No. 16/916,907, filed Jun. 30, 2020.
Co-ending U.S. Appl. No. 16/917,044, filed Jun. 30, 2020.
Co-pending U.S. Appl. No. 17/137,516, filed Dec. 30, 2020.
Co-pending U.S. Appl. No. 16/913,302, filed Jun. 26, 2020.
Co-pending U.S. Appl. No. 17/137,711, filed Dec. 30, 2020.
Co-pending U.S. Appl. No. 16/913,351, filed Jun. 26, 2020.
Co-pending U.S. Appl. No. 17/137,626, filed Dec. 30, 2020.
Co-pending U.S. Appl. No. 16/913,626, filed Jun. 26, 2020.
Co-pending U.S. Appl. No. 17/149,161, filed Jan. 14, 2021.
Co-pending U.S. Appl. No. 17/161,879, filed Jan. 29, 2021.
Co-pending U.S. Appl. No. 17/177,262, filed Feb. 17, 2021.

* cited by examiner

IMAGE BASED LEARNING CORRECTION FOR MITIGATING THERMAL GHOSTING IN A DIGITAL PRINTER

FIELD OF DISCLOSURE

This invention relates generally to printing systems, and more particularly, to fountain solution deposition systems and methods for use in lithographic offset printing systems.

BACKGROUND

Conventional lithographic printing techniques cannot accommodate true high speed variable data printing processes in which images to be printed change from impression to impression, for example, as enabled by digital printing systems. The lithography process is often relied upon, however, because it provides very high quality printing due to the quality and color gamut of the inks used. Lithographic inks are also less expensive than other inks, toners, and many other types of printing or marking materials.

Ink-based digital printing uses a variable data lithography printing system, or digital offset printing system, or a digital advanced lithography imaging system. A "variable data lithography system" is a system that is configured for lithographic printing using lithographic inks and based on digital image data, which may be variable from one image to the next. "Variable data lithography printing," or "digital ink-based printing," or "digital offset printing," or digital advanced lithography imaging is lithographic printing of variable image data for producing images on a substrate that are changeable with each subsequent rendering of an image on the substrate in an image forming process.

For example, a digital offset printing process may include transferring ink onto a portion of an imaging member (e.g., fluorosilicone-containing imaging member, imaging blanket, printing plate) that has been selectively coated with a fountain solution (e.g., dampening fluid) layer according to variable image data. According to a lithographic technique, referred to as variable data lithography, a non-patterned reimageable surface of the imaging member is initially uniformly coated with the fountain solution layer. An imaging system then evaporates regions of the fountain solution layer in an image area by exposure to a focused radiation source (e.g., a laser light source, high power laser) to form pockets. A temporary pattern latent image in the fountain solution is thereby formed on the surface of the digital offset imaging member. The latent image corresponds to a pattern of the applied fountain solution that is left over after evaporation. Ink applied thereover is retained in the pockets where the laser has vaporized the fountain solution. Conversely, ink is rejected by the plate regions where fountain solution remains. The inked surface is then brought into contact with a substrate at a transfer nip and the ink transfers from the pockets in the fountain solution layer to the substrate. The fountain solution may then be removed, a new uniform layer of fountain solution applied to the printing plate, and the process repeated.

Digital printing is generally understood to refer to systems and methods of variable data lithography, in which images may be varied among consecutively printed images or pages. "Variable data lithography printing," or "ink-based digital printing," or "digital offset printing" are terms generally referring to printing of variable image data for producing images on a plurality of image receiving media substrates, the images being changeable with each subsequent rendering of an image on an image receiving media substrate in an image forming process. "Variable data lithographic printing" includes offset printing of ink images generally using specially-formulated lithographic inks, the images being based on digital image data that may vary from image to image, such as, for example, between cycles of an imaging member having a reimageable surface. Examples are disclosed in U.S. Patent Application Publication No. 2012/0103212 A1 (the '212 Publication) published May 3, 2012 based on U.S. patent application Ser. No. 13/095,714, and U.S. Patent Application Publication No. 2012/0103221 A1 (the '221 Publication) also published May 3, 2012 based on U.S. patent application Ser. No. 13/095,778.

The inventors have found that when printing, heat signatures (e.g., thermal ghosting) from images printed on previous imaging member surface revolutions may be observed on subsequent revolutions. The observed thermal ghosting causes objectionable image quality artifacts in subsequent prints.

SUMMARY

The following presents a simplified summary in order to provide a basic understanding of some aspects of one or more embodiments or examples of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later. Additional goals and advantages will become more evident in the description of the figures, the detailed description of the disclosure, and the claims.

The foregoing and/or other aspects and utilities embodied in the present disclosure may be achieved by providing a method for mitigating thermal ghosting on a printed image with an ink-based digital image forming device having a rotatable imaging member with a reimageable surface in an environment having an ambient temperature. The exemplary method includes: a) after an imaging of a prior digital image on the reimageable surface, measuring temperatures of the reimageable surface with a temperature sensor adjacent the reimageable surface, the temperatures being affected by stress induced by the imaging, b) aligning information of a current digital image with a temperature map of the reimageable surface where the current digital image will be rendered, the information including a pixel-wise gray level of the current digital image, the temperature map associated with the measured temperatures by the temperature sensor, c) determining a corrected current digital image including a gray level modification of the current digital image based on the pixel-wise gray level of the current digital image and the temperature map to decrease marking material density at reimageable surface discrete coordinates that are warmer than a reference temperature and prevent ghosting of the prior digital image on a printing of the current digital image, and d) rendering the corrected current digital image on the reimageable surface for a printing by the ink-based digital image forming device, the printing of the rendered corrected current digital image appearing not as the corrected current digital image, but as the current digital image.

According to aspects illustrated herein, an image formation apparatus for mitigating thermal ghosting on a printed image with an ink-based digital image forming device having a rotatable imaging member with a reimageable surface in an environment having an ambient temperature is described. The image formation apparatus includes a controller, a temperature sensor adjacent the reimageable surface, and a storage device coupled to the controller, with the storage device having instructions operative on the controller to execute steps in methods described herein.

According to aspects described herein, an exemplary method for mitigating thermal ghosting on a printed image with an ink-based digital image forming device having a rotatable imaging member with a reimageable surface in an environment having an ambient temperature is discussed. The method includes: a) creating a temperature map of the reimageable surface based on measured temperature increases above a reference temperature for a plurality of reimageable surface discrete coordinates on the reimageable surface, the reference temperature associated with a temperature at a background area of the reimageable surface different than where the prior digital image was rendered on the reimageable surface, the temperature increases for the plurality of reimageable surface discrete coordinates resulting from imaging of prior digital images on the reimageable surface, b) aligning information of a current digital image with the temperature map of the reimageable surface where the current digital image will be rendered, the information including a pixel-wise gray level of the current digital image, c) determining a corrected current digital image including a gray level modification of the current digital image based on the pixel-wise gray level of the current digital image and the aligned temperature map to decrease marking material density at reimageable surface discrete coordinates that are warmer than the background area and prevent ghosting of the prior digital image on a printing of the current digital image, and d) rendering the corrected current digital image on the reimageable surface for a printing by the ink-based digital image forming device, the printing of the rendered corrected current digital image appearing not as the corrected current digital image, but as the current digital image.

Exemplary embodiments are described herein. It is envisioned, however, that any system that incorporates features of apparatus and systems described herein are encompassed by the scope and spirit of the exemplary embodiments.

BRIEF DESCRIPTION OF THE DRAWINGS

Various exemplary embodiments of the disclosed apparatuses, mechanisms and methods will be described, in detail, with reference to the following drawings, in which like referenced numerals designate similar or identical elements, and.

DETAILED DESCRIPTION

Figure 1:
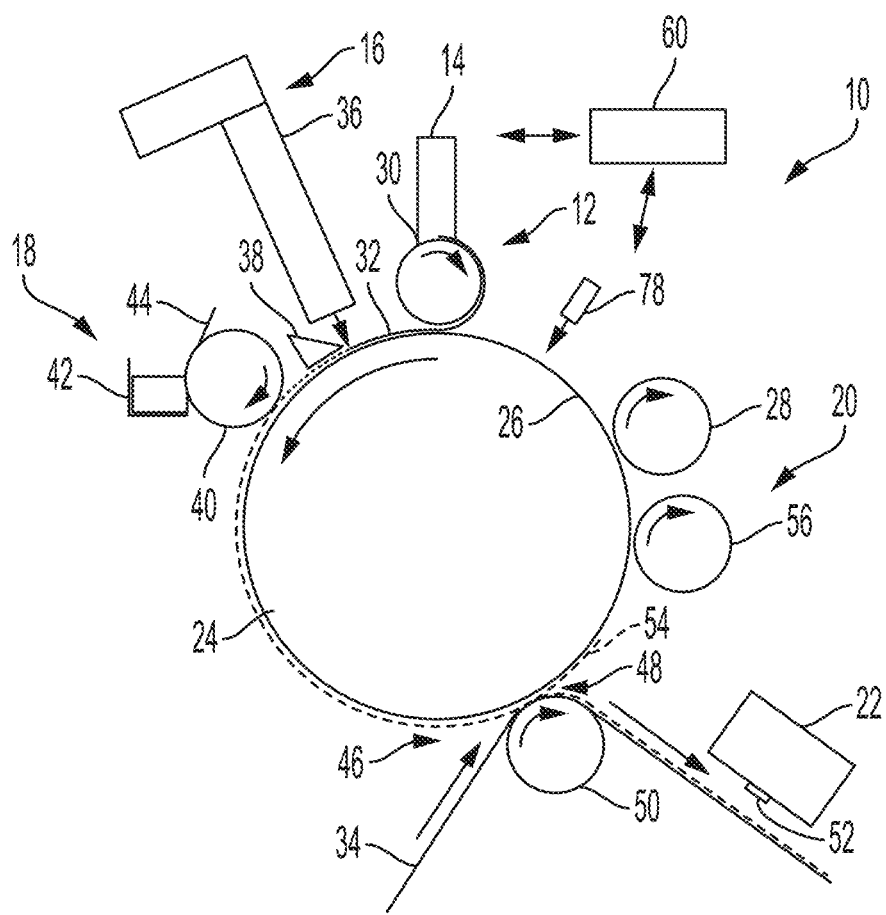
FIG. 1 is block diagram of a digital image forming device in accordance with examples of the embodiments.

Illustrative examples of the devices, systems, and methods disclosed herein are provided below. An embodiment of the devices, systems, and methods may include any one or more, and any combination of, the examples described below. This invention may, however, be embodied in many different forms and should not be construed as limited to the embodiments set forth below. Rather, these exemplary embodiments are provided so that this disclosure will be thorough and complete, and will fully convey the scope of the invention to those skilled in the art. Accordingly, the exemplary embodiments are intended to cover all alternatives, modifications, and equivalents as may be included within the spirit and scope of the apparatuses, mechanisms and methods as described herein.

We initially point out that description of well-known starting materials, processing techniques, components, equipment and other well-known details may merely be summarized or are omitted so as not to unnecessarily obscure the details of the present disclosure. Thus, where details are otherwise well known, we leave it to the application of the present disclosure to suggest or dictate choices relating to those details. The drawings depict various examples related to embodiments of illustrative methods, apparatus, and systems for inking from an inking member to the reimageable surface of a digital imaging member.

When referring to any numerical range of values herein, such ranges are understood to include each and every number and/or fraction between the stated range minimum and maximum. For example, a range of 0.5-6% would expressly include the endpoints 0.5% and 6%, plus all intermediate values of 0.6%, 0.7%, and 0.9%, all the way up to and including 5.95%, 5.97%, and 5.99%. The same applies to each other numerical property and/or elemental range set forth herein, unless the context clearly dictates otherwise.

The modifier "about" used in connection with a quantity is inclusive of the stated value and has the meaning dictated by the context (for example, it includes at least the degree of error associated with the measurement of the particular quantity). When used with a specific value, it should also be considered as disclosing that value. For example, the term "about 2" also discloses the value "2" and the range "from about 2 to about 4" also discloses the range "from 2 to 4."

The term "controller" or "control system" is used herein generally to describe various apparatus such as a computing device relating to the operation of one or more device that directs or regulates a process or machine. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

Embodiments as disclosed herein may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, and the like that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described therein.

Although embodiments of the invention are not limited in this regard, discussions utilizing terms such as, for example, "processing," "computing," "calculating," "determining," "using," "establishing", "analyzing", "checking", or the like, may refer to operation(s) and/or process(es) of a controller, computer, computing platform, computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "media", "print media", "print substrate" and "print sheet" generally refers to a usually flexible physical sheet of paper, polymer, Mylar material, plastic, or other suitable physical print media substrate, sheets, webs, etc., for images, whether precut or web fed. The listed terms "media", "print media", "print substrate" and "print sheet" may also include woven fabrics, non-woven fabrics, metal films, and foils, as readily understood by a skilled artisan.

The term "image forming device", "printing device" or "printing system" as used herein may refer to a digital copier or printer, scanner, image printing machine, xerographic device, electrostatographic device, digital production press, document processing system, image reproduction machine, bookmaking machine, facsimile machine, multi-function machine, or generally an apparatus useful in performing a print process or the like and can include several marking engines, feed mechanism, scanning assembly as well as other print media processing units, such as paper feeders, finishers, and the like. A "printing system" may handle sheets, webs, substrates, and the like. A printing system can place marks on any surface, and the like, and is any machine that reads marks on input sheets; or any combination of such machines.

The term "fountain solution" or "dampening fluid" refers to dampening fluid that may coat or cover a surface of a structure (e.g., imaging member, transfer roll) of an image forming device to affect connection of a marking material (e.g., ink, toner, pigmented or dyed particles or fluid) to the surface. The fountain solution may include water optionally with small amounts of additives (e.g., isopropyl alcohol, ethanol) added to reduce surface tension as well as to lower evaporation energy necessary to support subsequent laser patterning. Low surface energy solvents, for example volatile silicone oils, can also serve as fountain solutions. Fountain solutions may also include wetting surfactants, such as silicone glycol copolymers. The fountain solution may include D4 or D5 dampening fluid alone, mixed, and/or with wetting agents. The fountain solution may also include Isopar G, Isopar H, Dowsil OS20, Dowsil OS30, and mixtures thereof.

Inking systems or devices may be incorporated into a digital offset image forming device architecture so that the inking system is arranged about a central imaging plate, also referred to as an imaging member. In such a system, the imaging member is a rotatable imaging member, including a conformable blanket around a central drum with the conformable blanket including the reimageable surface. This blanket layer has specific properties such as composition, surface profile, and so on so as to be well suited for receipt and carrying a layer of a fountain solution. A surface of the imaging member is reimageable making the imaging member a digital imaging member. The surface is constructed of elastomeric materials and conformable. A paper path architecture may be situated adjacent the imaging member to form a media transfer nip.

A layer of fountain solution may be applied to the surface of the imaging member by a dampening system. In a digital evaporation step, particular portions of the fountain solution layer deposited onto the surface of the imaging member may be evaporated by a digital evaporation system. For example, portions of the fountain solution layer may be vaporized by an optical patterning subsystem such as a scanned, modulated laser that patterns the fluid solution layer to form a latent image. In a vapor removal step, the vaporized fountain solution may be collected by a vapor removal device or vacuum to prevent condensation of the vaporized fountain solution back onto the imaging plate.

In an inking step, ink may be transferred from an inking system to the surface of the imaging member such that the ink selectively resides in evaporated voids formed by the patterning subsystem in the fountain solution layer to form an inked image. In an image transfer step, the inked image is then transferred to a print substrate such as paper via pressure at the media transfer nip.

In a variable lithographic printing process, previously imaged ink must be removed from the imaging member surface to prevent ghosting. After an image transfer step, the surface of the imaging member may be cleaned by a cleaning system so that the printing process may be repeated. For example, tacky cleaning rollers may be used to remove residual ink and fountain solution from the surface of the imaging member.

A drawback of the vapor deposition approach of applying fountain solution discussed above is its sensitivity to the temperature of the imaging member surface. The amount of fountain solution that condenses depends on the temperature of the adjacent imaging member surface. Therefore, if the imaging member surface temperature changes, the amount of deposited fountain solution changes. Accordingly, if the imaging member surface temperature is non-uniform, the amount of deposited fountain solution will be non-uniform. Additionally, if the imaging member surface temperature is non-uniform, the amount of fountain solution that naturally evaporates between the vapor deposition step and the inking step will be non-uniform.

Changes or non-uniformities of the deposited fountain solution layer directly impact image quality performance. To some extent, this impact may be expected and desired where laser patterning heats the top surface of the imaging member in a digital fashion. The laser used to generate the latent image in the fountain solution layer creates a localized high temperature region that may be at about the boiling point of the fountain solution, e.g., about 175° C. Since the fountain solution is transparent, the laser energy is absorbed by the blanket surface where a small portion of the total energy is conducted into the fountain solution to evaporate or boil it away and create a latent image. The majority of the energy is conducted through the blanket and is dissipated into the central drum, which may be temperature controlled via liquid in a drum chilling system, as described by example in greater detail below.

However, unintended non-uniformities in the imaging member surface temperatures are not desired. When used, for example, for multiple prints, even though the imaging member may be rotating in a more continuous manner, transient heating may be induced by selective heating of the imaging member surface by a laser. Since the imaging member blanket surface is constructed of elastomeric materials, its thermal conductivity is relatively low and therefore is relatively inefficient at moving heat. The heat injected into the imaging member surface by the laser likely does not dissipate in one revolution and increases the surface temperature until a steady state temperature is achieved. Consequently, when printing, heat signatures (thermal ghosting) from the images printed on previous drum revolutions are observed on subsequent revolutions. The observed thermal ghosting may cause objectionable image quality artifacts in the prints. The regions of the blanket that are warmer will have darker halftones compared to relatively cooler regions of the blanket. Testing has identified that thermal ghosting from temperature differences on the imaging member surface on the order of 1° C. and above will yield an objectionable image artifact.

FIG. 1 depicts an exemplary ink-based digital image forming device 10. The image forming device 10 may include dampening station 12 having fountain solution applicator 14, optical patterning subsystem 16, inking apparatus 18, and a cleaning device 20. The image forming device 10 may also include one or more rheological conditioning subsystems 22 as discussed, for example, in greater detail below. FIG. 1 shows the fountain solution applicator 14 arranged with a digital imaging member 24 having a reimageable surface 26. While FIG. 1 shows components that are formed as rollers, other suitable forms and shapes may be implemented.

The imaging member surface 26 may be wear resistant and flexible. The surface 26 may be reimageable and conformable, having an elasticity and durometer, and sufficient flexibility for coating ink over a variety of different media types having different levels of roughness. A thickness of the reimageable surface layer may be, for example, about 0.5 millimeters to about 4 millimeters. The surface 26 should have a weak adhesion force to ink, yet good oleophilic wetting properties with the ink for promoting uniform inking of the reimageable surface and subsequent transfer lift of the ink onto a print substrate.

The soft, conformable surface 26 of the imaging member 24 may include, for example, hydrophobic polymers such as silicones, partially or fully fluorinated fluorosilicones and FKM fluoroelastomers. Other materials may be employed, including blends of polyurethanes, fluorocarbons, polymer catalysts, platinum catalyst, hydrosilyation catalyst, etc. The surface may be configured to conform to a print substrate on which an ink image is printed. To provide effective wetting of fountain solutions such as water-based dampening fluid, the silicone surface need not be hydrophilic, but may be hydrophobic. Wetting surfactants, such as silicone glycol copolymers, may be added to the fountain solution to allow the fountain solution to wet the reimageable surface 26. The imaging member 24 may include conformable reimageable surface 26 of a blanket or belt wrapped around a roll or drum.

The reimageable surface 26 or any of the underlying layers of the reimageable belt/blanket may incorporate a radiation sensitive filler material that can absorb laser energy or other highly directed energy in an efficient manner. Examples of suitable radiation sensitive materials are, for example, microscopic (e.g., average particle size less than 10 micrometers) to nanometer sized (e.g., average particle size less than 1000 nanometers) carbon black particles, carbon black in the form of nano particles of, single or multi-wall nanotubes, graphene, iron oxide nano particles, nickel plated nano particles, etc., added to the polymer in at least the near-surface region. It is also possible that no filler material is needed if the wavelength of a laser is chosen so to match an absorption peak of the molecules contained within the fountain solution or the molecular chemistry of the outer surface layer. As an example, a 2.94 μm wavelength laser would be readily absorbed due to the intrinsic absorption peak of water molecules at this wavelength.

The imaging member surface 26 may be temperature controlled to aid in a printing operation. For example, the imaging member 24 may be cooled internally (e.g., with chilled fluid via a central drum chiller 62 refrigerant line that cools the imaging member drum) or externally (e.g., via a blanket chiller roll 28) to a temperature (e.g., about 10° C.-60° C.) that may aid in the image forming, transfer and cleaning operations of image forming device 10. The imaging member may be cooled according to a temperature setpoint of the drum chilling system including the central drum chiller 62 and/or blanket chiller roll 28. The temperature setpoint may be predetermined (e.g., about 0° C.-60° C.) or adjusted within a predetermined range as readily understood by a skilled artisan.

The central drum chiller 62 may include a housing (e.g., roller, duct) in contact with the inner wall of the imaging member drum. The chiller is not limited to the size of the cylindrical housing shown in FIG. 1, and may expand to even include the inner wall of the imaging member drum. In other words, an exemplary central drum chiller 62 may expand to the imaging member drum, which may then define the cylindrical housing of the chiller. The central drum chiller 62 provides internal chilling or temperature control to the imaging member drum via fluid circulated through the interior of the hollow chiller. The drum chilling system may pump and recirculate the fluid into and out of the chiller 62. The drum chilling system may also include a refrigeration system heat exchanger, and even a heating system to remove or add heat, respectively, from the re-circulating fluid depending on the current fluid temperature and the temperature setpoint of the drum chilling system. Heat absorbed by the fluid while in contact with the inner surface of the hollow chiller 62 and the imaging member drum may be removed by the drum chilling system. In examples where the imaging member drum inner wall includes the cylindrical chiller housing, chilled fluid internal to the hollow drum enables a longer dwell time to remove heat, since the chilled fluid may fill the inside of the drum and maximize a heat exchange contact area.

The fountain solution applicator 14 may be configured to deposit a layer of fountain solution onto the imaging member surface 26 directly or via an intermediate member (e.g., roller 30) of the dampening station 12. While not being limited to particular configuration, the fountain solution applicator 14 may include a series of rollers or sprays (not shown) for uniformly wetting the reimageable surface 26 with a uniform layer of fountain solution with the thickness of the layer being controlled. The series of rollers may be considered as dampening rollers or a dampening unit, for uniformly wetting the reimageable surface 26 with a layer of fountain solution. The fountain solution may be applied by fluid or vapor deposition to create a thin layer 32 (e.g., between about 0.01 µm and about 1.0 µm in thickness, less than 5 nm, about 20 nm-100 nm) of the fountain solution for uniform wetting and pinning.

The optical patterning subsystem 16 is located downstream the fountain solution applicator 14 in the printing processing direction to selectively pattern a latent image in the layer of fountain solution by image-wise patterning using, for example, laser energy. For example, the fountain solution layer is exposed to an energy source (e.g. a laser) that selectively applies energy to portions of the layer to image-wise evaporate the fountain solution and create a latent "negative" of the ink image that is desired to be printed on a receiving substrate 34. Image areas are created where ink is desired, and non-image areas are created where the fountain solution remains. While the optical patterning subsystem 16 is shown as including laser emitter 36, it should be understood that a variety of different systems may be used to deliver the optical energy to pattern the fountain solution layer.

Still referring to FIG. 1, a vapor vacuum 38 or air knife may be positioned downstream the optical patterning subsystem to collect vaporized fountain solution and thus avoid leakage of excess fountain solution into the environment. Reclaiming excess vapor prevents fountain solution from depositing uncontrollably prior to the inking apparatus 18 and imaging member 24 interface. The vapor vacuum 38 may also prevent fountain solution vapor from entering the environment. Reclaimed fountain solution vapor can be condensed, filtered and reused as understood by a skilled artisan to help minimize the overall use of fountain solution by the image forming device 10.

Following patterning of the fountain solution layer by the optical patterning subsystem 16, the patterned layer over the reimageable surface 26 is presented to the inking apparatus 18. The inker apparatus 18 is positioned downstream the optical patterning subsystem 16 to apply a uniform layer of ink over the layer of fountain solution and the reimageable surface layer 26 of the imaging member 24. The inking apparatus 18 may deposit the ink to the evaporated pattern representing the imaged portions of the reimageable surface 26, while ink deposited on the unformatted portions of the fountain solution will not adhere based on a hydrophobic and/or oleophobic nature of those portions. The inking apparatus may heat the ink before it is applied to the surface 26 to lower the viscosity of the ink for better spreading into imaged portion pockets of the reimageable surface. For example, one or more rollers 40 of the inking apparatus 18 may be heated, as well understood by a skilled artisan. Inking roller 40 is understood to have a structure for depositing marking material onto the reimageable surface layer 26, and may include an anilox roller or an ink nozzle. Excess ink may be metered from the inking roller 40 back to an ink container 42 of the inker apparatus 18 via a metering member 44 (e.g., doctor blade, air knife).

Although the marking material may be an ink, such as a UV-curable ink, the disclosed embodiments are not intended to be limited to such a construct. The ink may be a UV-curable ink or another ink that hardens when exposed to UV radiation. The ink may be another ink having a cohesive bond that increases, for example, by increasing its viscosity. For example, the ink may be a solvent ink or aqueous ink that thickens when cooled and thins when heated.

Downstream the inking apparatus 18 in the printing process direction resides ink image transfer station 46 that transfers the ink image from the imaging member surface 26 to a print substrate 34. The transfer occurs as the substrate 34 is passed through a transfer nip 48 between the imaging member 24 and an impression roller 50 such that the ink within the imaged portion pockets of the reimageable surface 26 is brought into physical contact with the substrate 34 and transfers via pressure at the transfer nip 48 from the imaging member surface 26 to the print substrate 34 as a print of the image.

Rheological conditioning subsystems 22 may be used to increase the viscosity of the ink at specific locations of the digital offset image forming device 10 as desired. While not being limited to a particular theory, rheological conditioning subsystem 22 may include a curing mechanism 52, such as a UV curing lamp (e.g., standard laser, UV laser, high powered UV LED light source), wavelength tunable photoinitiator, or other UV source, that exposes the ink to an amount of UV light (e.g., # of photons radiation) to at least partially cure the ink/coating to a tacky or solid state. The curing mechanism may include various forms of optical or photo curing, thermal curing, electron beam curing, drying, or chemical curing. In the exemplary image forming device 10 depicted in FIG. 1, rheological conditioning subsystem 22 may be positioned adjacent the substrate 34 downstream the ink image transfer station 46 to cure the ink image transferred to the substrate. Rheological conditioning subsystems 22 may also be positioned adjacent the imaging member surface 26 between the ink image transfer station 46 and cleaning device 20 as a preconditioner to harden any residual ink 54 for easier removal from the imaging member surface 26 that prepares the surface to repeat the digital image forming operation.

This residual ink removal is most preferably undertaken without scraping or wearing the imageable surface of the imaging member. Removal of such remaining fluid residue may be accomplished through use of some form of cleaning device 20 adjacent the surface 26 between the ink image transfer station 46 and the fountain solution applicator 14. Such a cleaning device 20 may include at least a first cleaning member 56 such as a sticky or tacky roller in physical contact with the imaging member surface 26, with the sticky or tacky roller removing residual fluid materials (e.g., ink, fountain solution) from the surface. The sticky or tacky roller may then be brought into contact with a smooth roller (not shown) to which the residual fluids may be transferred from the sticky or tacky member, the fluids being subsequently stripped from the smooth roller by, for example, a doctor blade or other like device and collected as waste. It is understood that the cleaning device 20 is one of numerous types of cleaning devices and that other cleaning devices designed to remove residual ink/fountain solution from the surface of imaging member 24 are considered within the scope of the embodiments. For example, the cleaning device could include at least one roller, brush, web, belt, tacky roller, buffing wheel, etc., as well understood by a skilled artisan.

In the image forming device 10, functions and utility provided by the dampening station 12, optical patterning subsystem 16, inking apparatus 18, cleaning device 20, rheological conditioning subsystems 22, imaging member 24, central drum chiller 62 and/or blanket chiller roll 28 may be controlled, at least in part by controller 60. Such a controller 60 is shown in FIG. 1 and may be further designed to receive information and instructions from a workstation or other image input device (e.g., computers, smart phones, laptops, tablets, kiosk) to coordinate the image formation on the print substrate through the various subsystems such as the dampening station 12, patterning subsystem 16, inking apparatus 18, and imaging member 24 as discussed in greater detail below and understood by a skilled artisan. The information may include an electronic version of the images instructed for printing from an image input device. This information may be modified by the controller 60 based on temperature differences across the imaging member surface 26 into corrected image information. This corrected image information may be processed by the controller 60 to render a corrected image based on the corrected image information via the optical patterning subsystem and inking apparatus onto the imaging member surface for transfer to print substrate 34.

As noted above, when printing multiple prints on the rotatable digital imaging member 24, heat signatures (thermal ghosting) from images printed on previous drum revolutions may be observed on subsequent revolutions. Examples of embodiments compensate for thermal ghosting by making the current digital image lighter in areas that will be imaged onto warmer blanket regions, thereby cancelling out tonal reproductive curve (TRC) differences between "warm" and "cool" regions of the imaging member surface 26.

Figure 2:
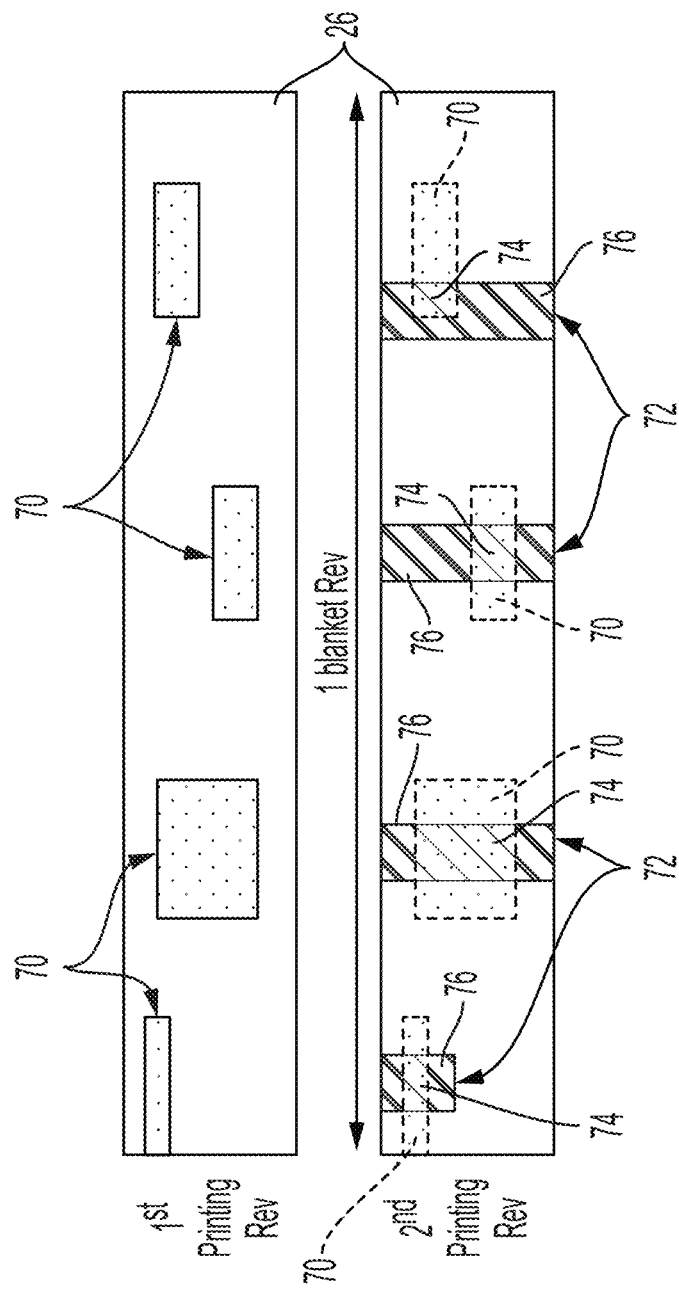
FIG. 2 illustrates an exemplary imaging member surface during printing revolutions.

FIG. 2 depicts an exemplary imaging member surface 26 during a first printing revolution of the imaging member 24 (FIG. 1) and a subsequent printing revolution of the imaging member drum. During a first printing revolution an image forming apparatus, such as the image forming device 10 (FIG. 1), renders a first image of marking material (e.g., ink) on first image regions 70 of the imaging member surface 26 by a printing operation as described for example above. The first image marking material is transferred to print substrate 34 (FIG. 1) and the surface 26 is cleaned, for example, by cleaning device 20 (FIG. 1). During a second or subsequent printing revolution of the imaging member 24, the imaging member surface at the first image regions 70 shown by dashed lines may be warmer than other areas of the imaging member surface not imaged during the first printing revolution. A second image of the marking material, shown for example as halftones, is rendered on second image regions 72. However, the halftones imaged on the second image regions 72 warmed at the first image regions 70 by the first image rendering during the first revolution of the imaging member 24 are imaged at a higher gray level value (i.e., higher gray level=lighter image). See lighter regions 74. Halftones may be imaged at different gray levels for example, by modifying the corresponding latent image made by the patterning subsystem 16 via the laser 36 (FIG. 1). The resulting second image print on the print substrate 34 (FIG. 1) is uniform due to the TRC differences between the warmer first image regions 70 and cooler non-first image regions 76. Here, TRC may refer to the printed density of a sweep of gray level patches. The gray level patches may be in units including Delta E or L*.

To help with understanding, it should be noted that differences in halftone apparent in FIG. 2 within second image regions 72 between lighter regions 74 and non-first image regions 76 illustrates a modification of image formation onto the reimageable surface 26. An actual representation of the reimageable imaging member surface may appear to show a more uniform halftone or contone replicative of the desired unmodified image due to lighter imaging at the lighter regions 74 having a warmer surface temperature remaining from a prior imaging. The corrected image transferred from the reimageable surface 26 to print substrate 34 thus appears not as the corrected current digital image, but as the originally intended digital image.

It is beneficial to know how much warmer the imaging member surface is after imaging thereon to accurately modify subsequent imaging on the reimageable surface and offset temporal differences caused by the prior imaging. According to related examples, a temperature map of the reimageable surface provides information corresponding to the imaging member surface temperature or temperature over a reference temperature, where the reference temperature is associated with a temperature of the reimageable surface at a background area different than where a previously printed digital image was rendered or imaged on the reimageable surface. Thus the temperature map may indicate temperature increases above a reference temperature for a plurality of discrete coordinates on the reimageable surface resulting from formation of at least one previously imaged digital image thereon. While the temperature map may change after every laser imaging, the temperature increase per laser imaging and other model parameters may be estimated in related examples based on an offline simulation and/or offline experimentation at, for example, a development laboratory or manufacturing factory. Thus in such related examples the model parameters may be assumed to be fixed. The temperature map temperature deltas in the related examples may thus be revised as needed based on the predicted fixed temperature increases at the reimageable surface discrete coordinates.

However, the inventors found that imaging member surface or imaging blanket properties may change over time due, for example, to aging or wear on the reimageable surface. These changes in properties may affect temperature deltas caused from image forming stresses. To help solve the problem of accurately predicting temperature differences caused by imaging on imaging member surfaces or blankets with properties that change over time, the inventors add a temperature sensor adjacent the imaging member surface that is configured or specially designed to measure the temperature of the reimageable surface at discrete coordinates thereon, including discrete coordinates having raised temperatures resulting from formation of a previously printed or imaged digital image on the reimageable surface. This approach provides real-time on-the-fly measurement of temperature and other model parameters and/or recalibrated estimations of model parameters during operation. In examples, a sensor 78 (e.g., temperature sensor, non-contact thermocouple, inline scanner, image on web array (IOWA) bar scanner) is used to measure the temperature of the imaging blanket due to the stresses induced by imaging. This data is used to learn the parameters of the temperature model periodically during operation for use in subsequent estimations. This approach provides benefits over related estimation approaches at least by allowing for changes in blanket properties (due to aging, wear etc.) to be comprehended.

The sensor 78 may measure the temperature of the imaging member surface 26 at various times before or during imaging. Before the printing, the sensor 78 may measure the surface temperature at any area of the blanket, including where upcoming imaging may occur to establish an initial reference temperature. After imaging, the sensor 78 may measure surface temperature changes caused by the imaging at discreet coordinates across the imaging member surface. The measurements may be used to adjust parameters of a temperature model for the temperature map based on the measured surface. This temperature model therefore becomes a learning model for image quality artifacts induced by imaging stresses that may be used with feed forward image based thermal modeling to predict the temperature map based on most recent measurements. The measurements may thus be used in real time and one-the-fly for more accurate determinations of the temperature map used to estimate gray level modifications of a next digital image to decrease marking material (e.g., ink) density at imaging member surface discrete coordinates that are warmer due to prior imaging so the next digital image is imaged at the modified gray levels to appear as desired without ghosting or inaccuracies caused by imaging on a variable temperature imaging surface.

Figure 3:
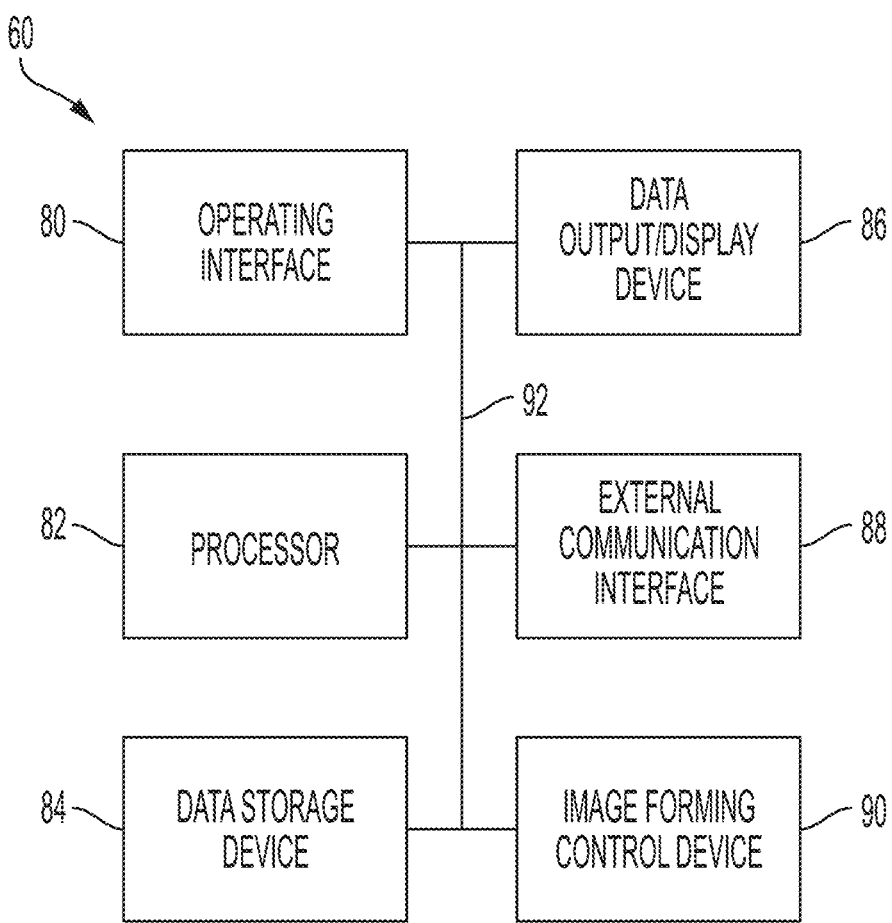
FIG. 3 is a block diagram of a controller with a processor for executing instructions to automatically control devices in the digital image forming device depicted in FIG. 1.

FIG. 3 illustrates a block diagram of the controller 60 for executing instructions to automatically control the digital image forming device 10 and components thereof. The exemplary controller 60 may provide input to or be a component of a controller for executing the image formation method in a system such as that depicted in FIG. 1 and described in greater detail below in FIG. 4.

The exemplary controller 60 may include an operating interface 80 by which a user may communicate with the exemplary control system. The operating interface 80 may be a locally-accessible user interface associated with the digital image forming device 10. The operating interface 80 may be configured as one or more conventional mechanism common to controllers and/or computing devices that may permit a user to input information to the exemplary controller 60. The operating interface 80 may include, for example, a conventional keyboard, a touchscreen with "soft" buttons or with various components for use with a compatible stylus, a microphone by which a user may provide oral commands to the exemplary controller 60 to be "translated" by a voice recognition program, or other like device by which a user may communicate specific operating instructions to the exemplary controller. The operating interface 80 may be a part or a function of a graphical user interface (GUI) mounted on, integral to, or associated with, the digital image forming device 10 with which the exemplary controller 60 is associated.

The exemplary controller 60 may include one or more local processors 82 for individually operating the exemplary controller 60 and for carrying into effect control and operating functions for image formation onto a print substrate 34, including rendering digital images, monitoring imaging member surface 26 rotational position, entering/maintaining temperature setpoints for the drum chilling system including the central drum chiller 62 and/or blanket chiller roll 28, measuring reimageable surface temperature and temperature deltas across the reimageable surface, determining and/or updating a temperature map in accordance with the measurements, determining gray-level modifications of current or upcoming digital images, and rendering corrected/modified digital images based on imaging member surface temperature deltas with the digital image forming device 10 with which the exemplary controller may be associated. Processor(s) 82 may include at least one conventional processor or microprocessor that interprets and executes instructions to direct specific functioning of the exemplary controller 60, and control of the image correction process with the exemplary controller.

The exemplary controller 60 may include one or more data storage devices 84. Such data storage device(s) 84 may be used to store data or operating programs to be used by the exemplary controller 60, and specifically the processor(s) 82. Data storage device(s) 84 may be used to store information regarding, for example, rotational location of the imaging member, location where a current image will be rendered on the imaging member surface, temperature maps of the imaging member surface, updated learned temperature module parameters based on temperature measurements, a thermal module, ambient temperature, imaging member temperature, temperature setpoints for the drum chilling system including the central drum chiller 62 and/or blanket chiller roll 28, a correction look-up table, thermal ghosting artifacts, digital images information, and corrected digital image information with which the digital image forming device 10 is associated. Stored imaging member rotational location, imaging member surface temperature maps, previous and current digital image information may be devolved into data to generate an open loop, 2-D correction of a current gray-level halftone or contone image that mitigates undesirable ghosting artifacts in the manner generally described by examples herein.

The data storage device(s) 84 may include a random access memory (RAM) or another type of dynamic storage device that is capable of storing updatable database information, and for separately storing instructions for execution of image correction operations by, for example, processor(s) 82. Data storage device(s) 84 may also include a read-only memory (ROM), which may include a conventional ROM device or another type of static storage device that stores static information and instructions for processor(s) 82. Further, the data storage device(s) 84 may be integral to the exemplary controller 60, or may be provided external to, and in wired or wireless communication with, the exemplary controller 60, including as cloud-based data storage components.

The data storage device(s) 84 may include non-transitory machine-readable storage medium to store the device queue manager logic persistently. While a non-transitory machine-readable storage medium is may be discussed as a single medium, the term "machine-readable storage medium"

should be taken to include a single medium or multiple media (e.g., a centralized or distributed database, and/or associated caches and servers) that store one or more sets of instructions. The term "machine-readable storage medium" shall also be taken to include any medium that is capable of storing or encoding a set of instruction for execution by the controller 60 and that causes the digital image forming device 10 to perform any one or more of the methodologies of the present embodiments and examples. The term "machine-readable storage medium" shall accordingly be taken to include, but not be limited to, solid-state memories, and optical and magnetic media.

The exemplary controller 60 may include at least one data output/display device 86, which may be configured as one or more conventional mechanisms that output information to a user, including, but not limited to, a display screen on a GUI of the digital image forming device 10 or associated image forming device with which the exemplary controller 60 may be associated. The data output/display device 86 may be used to indicate to a user a status of the digital image forming device 10 with which the exemplary controller 60 may be associated including an operation of one or more individually controlled components at one or more of a plurality of separate image processing stations or subsystems associated with the image forming device.

The exemplary controller 60 may include one or more separate external communication interfaces 88 by which the exemplary controller 60 may communicate with components that may be external to the exemplary control system such as a temperature sensor 78 (which may include an inline bar scanner), printer or other image forming device. At least one of the external communication interfaces 88 may be configured as an input port to support connecting an external CAD/CAM device storing modeling information for execution of the control functions in the image formation and correction operations. Any suitable data connection to provide wired or wireless communication between the exemplary controller 60 and external and/or associated components is contemplated to be encompassed by the depicted external communication interface 88.

The exemplary controller 60 may include a correction image forming control device 90 that may be used to control the image correction process to render corrective images modified from desired image data for printing the desired image without ghosting artifacts. For example, the correction image forming control device 90 may render corrected current digital images on the reimageable surface 26 for transfer to print substrate 34 as a printing of the desired digital image. The correction image forming control device 90 may operate as a part or a function of the processor 82 coupled to one or more of the data storage devices 84 and the digital image forming device 10 (e.g., optical patterning subsystem 16, inking apparatus 18, dampening station 12), or may operate as a separate stand-alone component module or circuit in the exemplary controller 60.

All of the various components of the exemplary controller 60, as depicted in FIG. 3, may be connected internally, and to the digital image forming device 10, associated image forming apparatuses downstream the image forming device and/or components thereof, by one or more data/control busses 92. These data/control busses 92 may provide wired or wireless communication between the various components of the image forming device 10 and any associated image forming apparatus, whether all of those components are housed integrally in, or are otherwise external and connected to image forming devices with which the exemplary controller 60 may be associated.

It should be appreciated that, although depicted in FIG. 3 as an integral unit, the various disclosed elements of the exemplary controller 60 may be arranged in any combination of sub-systems as individual components or combinations of components, integral to a single unit, or external to, and in wired or wireless communication with the single unit of the exemplary control system. In other words, no specific configuration as an integral unit or as a support unit is to be implied by the depiction in FIG. 3. Further, although depicted as individual units for ease of understanding of the details provided in this disclosure regarding the exemplary controller 60, it should be understood that the described functions of any of the individually-depicted components, and particularly each of the depicted control devices, may be undertaken, for example, by one or more processors 82 connected to, and in communication with, one or more data storage device(s) 84.

Figure 4:
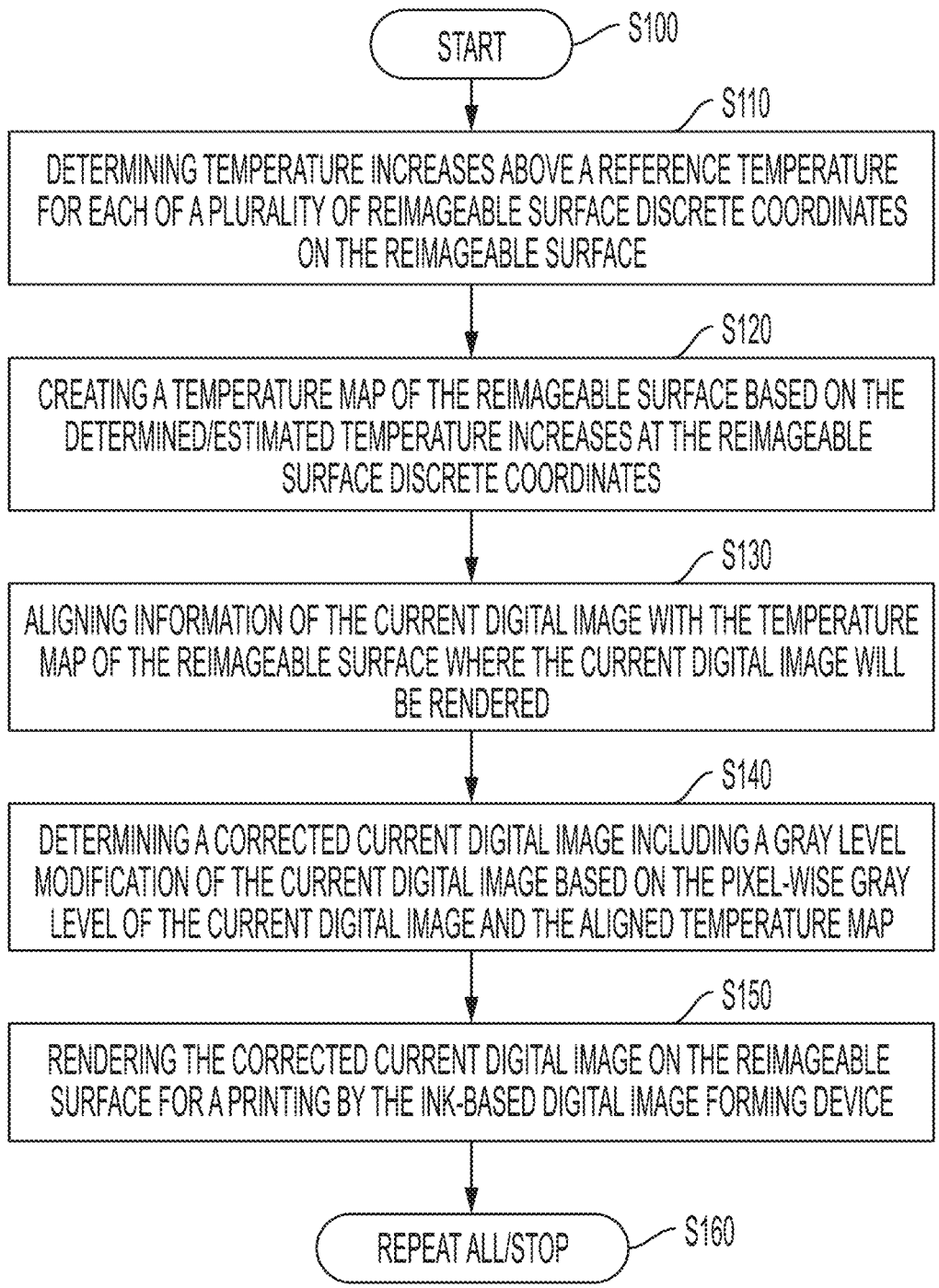
FIG. 4 is a flowchart depicting the operation of an exemplary image forming device.

The disclosed embodiments may include an exemplary method for printing a plurality of images including a current digital image and a previously imaged prior digital image with the digital image forming device 10, the current image rendered with correction to the gray-level halftone or contone thereof that mitigates undesirable ghosting artifacts. FIG. 4 illustrates a flowchart of such an exemplary method. As shown in FIG. 4, operation of the method commences at Step S100 and proceeds to Step S110.

At Step S110, a controller 60 or processor 82 thereof determines temperature increases above a reference temperature for a plurality of reimageable surface discrete coordinates on the reimageable surface. The reimageable surface discrete coordinates may be reimageable surface discrete pixel coordinates. The reference temperature may be associated with or correspond to a temperature at a background area of the reimageable surface different than where the previously imaged prior digital image was rendered on the reimageable surface. The reference temperature may be estimated from or corresponding to a temperature setpoint of the central drum chiller 62. The temperature at the background area of the reimageable surface different than where the previously imaged prior digital image was rendered on the reimageable surface may be influenced by the temperature setpoint of the central drum chilling system. The reference temperature may be estimated based on other factors such as prior testing or ambient temperature and number of printings over a prior period (e.g., 10 seconds-two minutes). The reference temperature may also correspond to the initial background temperature of the reimageable surface prior to imaging. This initial background temperature may be measured by the sensor 78 (FIG. 1) adjacent the dampening station 12. The sensor 78 may be controlled, at least in part by controller 60.

The temperature increases for the plurality of reimageable surface discrete coordinates results from formation of the previously imaged prior digital image on the reimageable surface. For example, predicted temperature increases may be determined based on previous printed images rendered on the reimageable surface, temporal 3D thermal conduction/diffusion, a temperature setpoint of the imaging member central drum chiller 62, and the ambient temperature. The temperatures may include tonal reproductive curve (TRC) data including object (e.g., input image) energy-to-displayed (e.g., reproduction) energy transformation data.

In related examples, the controller 60 or processor 82 thereof may estimate the temperature delta (ΔT) on the entire reimageable surface 26 of the imaging member 24 over time. ΔT is defined as the temperature rise above a hypothetical reference imaging member where no image is printed (i.e. background area), but otherwise is similar to the imaging member in all other respects. Here, $\Delta T(n,x_d,y_d)$ refers to the temperature rise at location $(x_d,y_d)$ on the imaging member surface 26 at imaging member 24 rotation ID n. Further, n=0 refers to the start of imaging member rotation, when the imaging member surface is at a pre-defined temperature (e.g., ambient temperature, a chiller water temperature used for imaging member cooling), and $\Delta T(0,x_d,y_d)=0$. The algorithm can be learned as a function of the input grey level patch or a linear non-contact temperature sensor (e.g., Melexis IR SMD temperature sensors) may be used to learn the algorithm as a function of temperature. The temperature data is used to learn parameters of a thermal model that can estimate the temperature of the blanket during active printing. The thermal model may also account for lateral thermal blooming which will also be learned from data.

The controller 60 or processor 82 thereof may estimate the temperature delta ($\Delta T$) on the entire reimageable surface 26 of the imaging member 24 over time based on actual temperature measurements in real time via an exemplary module:

$$\Delta T(n, x_d, y_d) = PSF\left(\left[\Delta T(n-1, x_d, y_d)e^{-t_d/\tau_d} + \Delta T_0(g_d(n, x_d, y_d))\right]; w\right) \quad (1)$$

The first term inside the parenthesis refers to thermal decay of the previous history at the pixel location on the drum, and the second term refers to contribution of the laser for the current pixel. Here $t_d$ is the time for one drum rotation, and $\tau_d$ is the time constant of temperature decay on the drum surface, which depends on the thermal properties of the different blanket layers and the heat transfer coefficient of the drum interior cooling. $\Delta T_0$ is the expected temperature rise immediately after imaging a gray level $g_d$ at $(x_d,y_d)$ in rotation n. The above discussed terms within the brackets (e.g., [ ]) may be estimated in situ empirically from the non-contact sensor 78 measurements instead of by offline estimation. PSF is a Gaussian point spread function used to account for lateral thermal diffusion at the surface, with w being the width of the Gaussian PSF which is dependent on the thermal diffusivity of the fluorosilicone surface layer in the blanket. Thus the drum thermal model has just three parameters: [$\tau_d$, $\Delta T_0(g)$, w].

Figure 5:
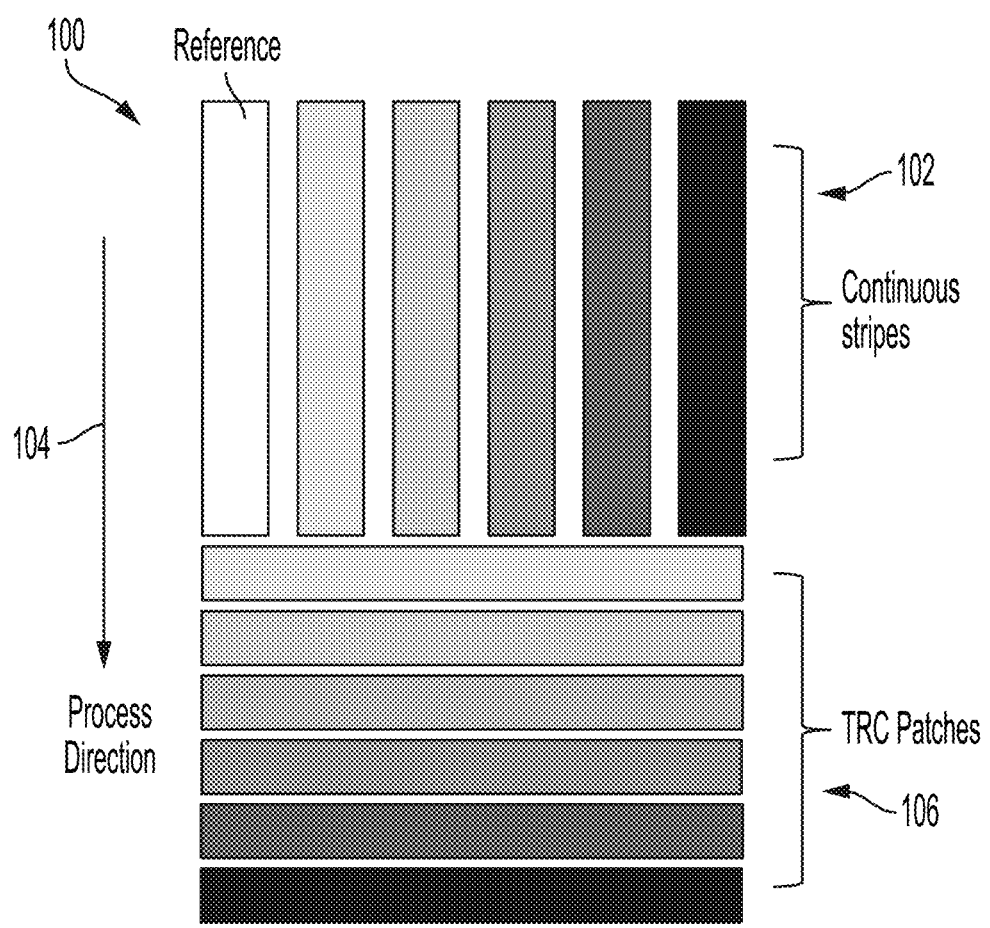
FIG. 5 is an exemplary image layout for learning temperature module parameters.

These parameters [$\tau$, $\Delta T_0(g)$, w] can be learned empirically from data. For example, shortly after an imaging or between imaging on different pages, a TRC test patch of predetermined desired density or halftone levels may be imaged and measured across the discreet coordinates of print regions on the reimageable imaging member surface. The temperature sensor 78 measures temperatures across the discreet coordinates. The parameters above may be set or revised based on the measurements. In examples, the parameters, and by extension the module of equation 1 above may be learned by printing different area coverage halftones (e.g., in a continuous stripe or other shape) followed by area coverage patches (e.g., TRC patches). See FIG. 5 for an exemplary image layout 100 including continuous stripes 102 of different area coverage halftones followed in a process direction 104 by TRC patches 106. The higher the area coverage of the stripes 102 the higher the temperature delta will be on the imaging member surface 26 due to the heat caused by the imaging of the stripes. The imaged TRC patches 106 may be scanned using an inline scanner (e.g., image on web array (IOWA) bar scanner) as understood by a skilled artisan to generate the TRCs. After scanning the test image layout 100 on the fly, including patches 106 as the output TRC or engine response curve (ERC), the controller can learn the influence of the input halftone continuous strips 102 which are the input TRC. The algorithm can be learned as a function of the input grey level patch or via the linear non-contact temperature sensor 78 (e.g., Melexis IR SMD temperature sensors) to learn the algorithm as a function of temperature. The temperature data measured by the sensor 78 may be used to learn parameters [$\tau_d$, $\Delta T_0(g)$, w] of a thermal model to estimate the temperature of the blanket during active printing.

Figure 6:
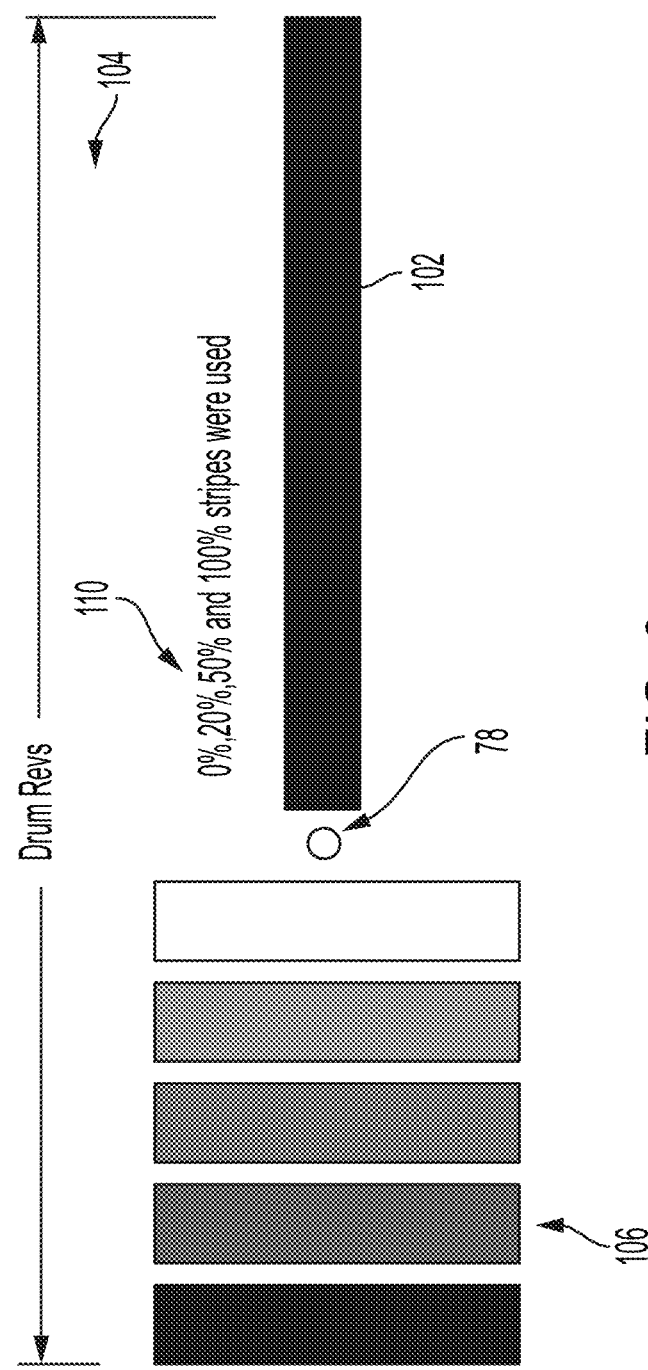
FIG. 6 illustrates an exemplary test image layout.
Figure 7:
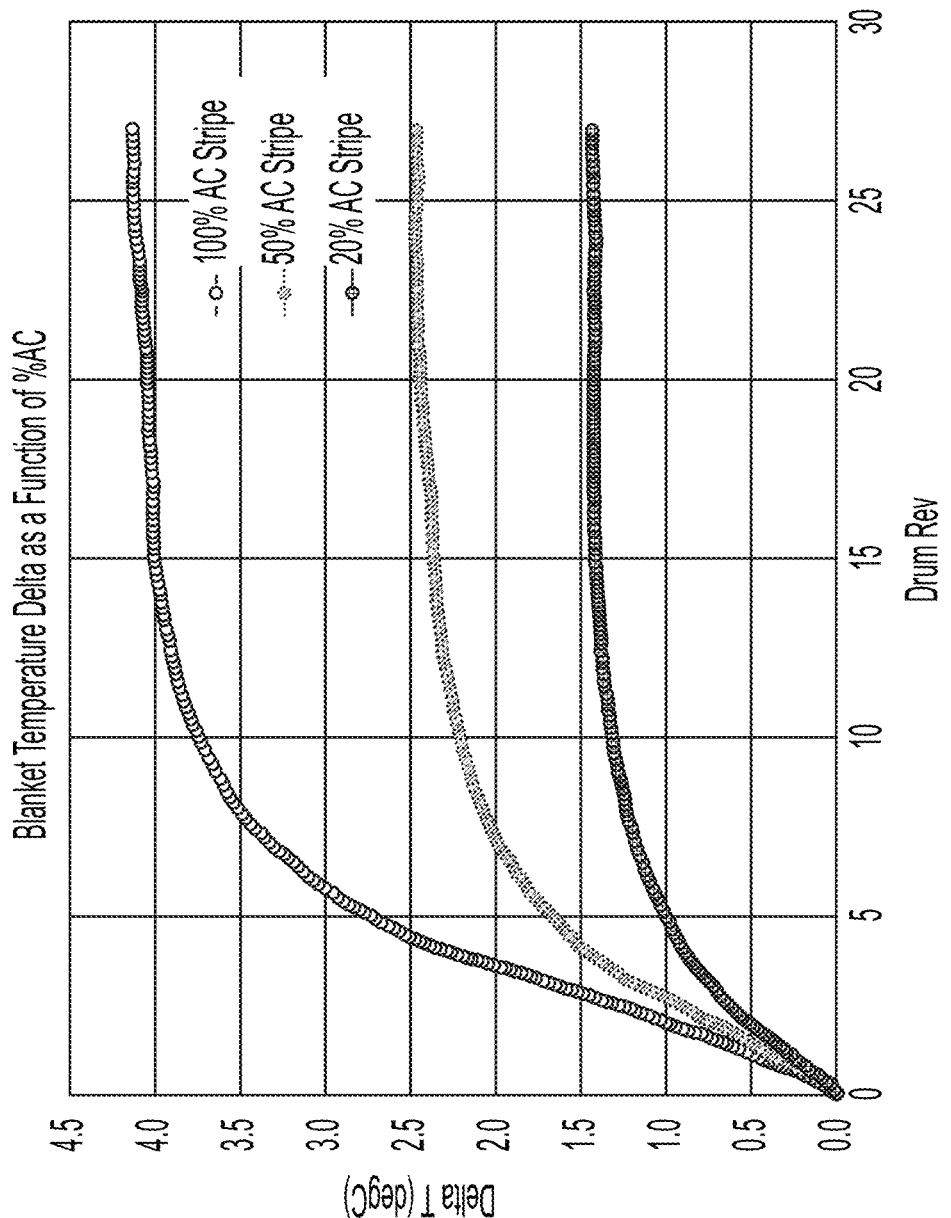
FIG. 7 is a graph showing blanket temperature delta relative to a zero % area coverage patch.
Figure 8:
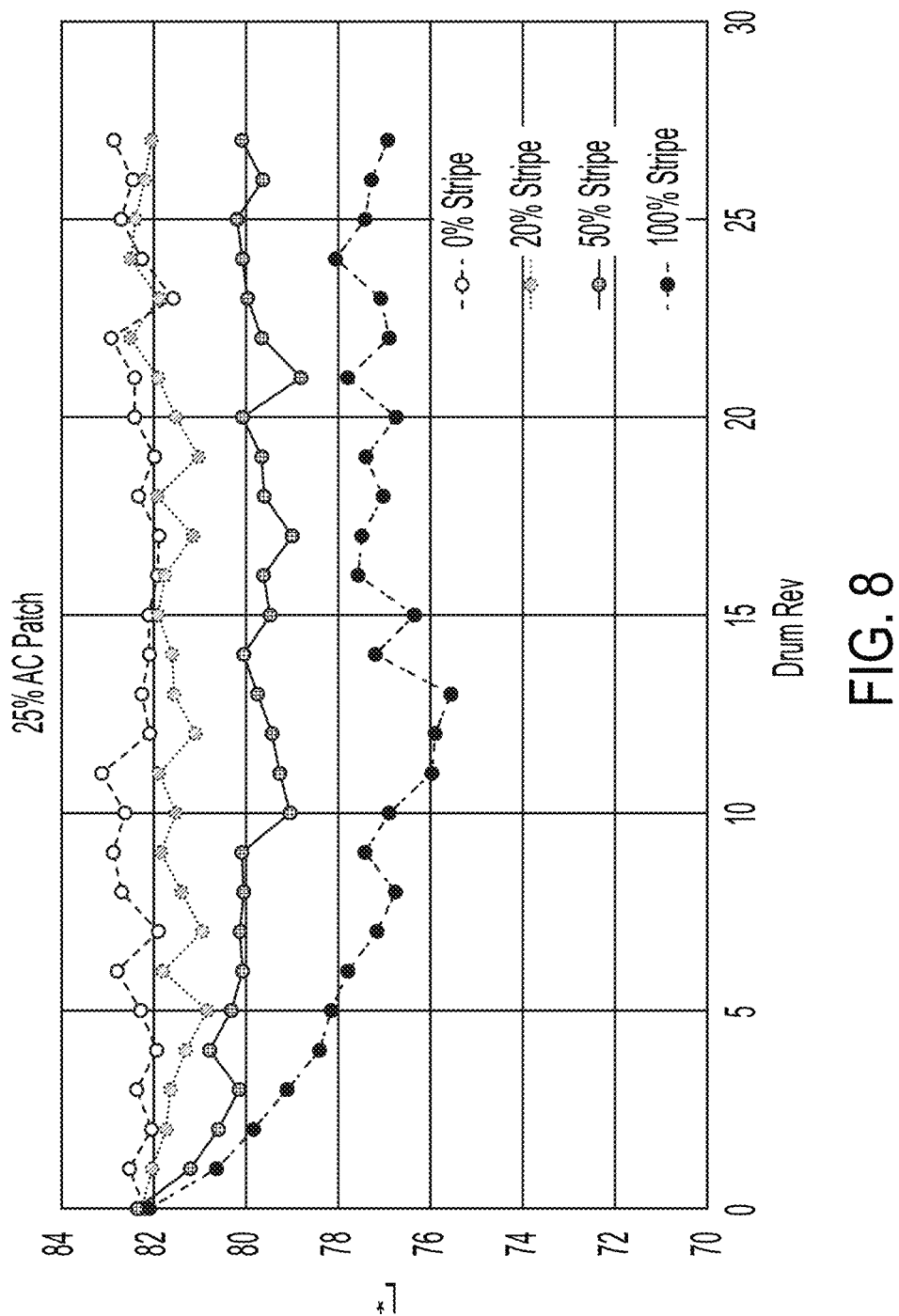
FIG. 8 is a graph illustrating brightness L*variation for 25% TRC patch from exemplary continuous stripes.
Figure 9:
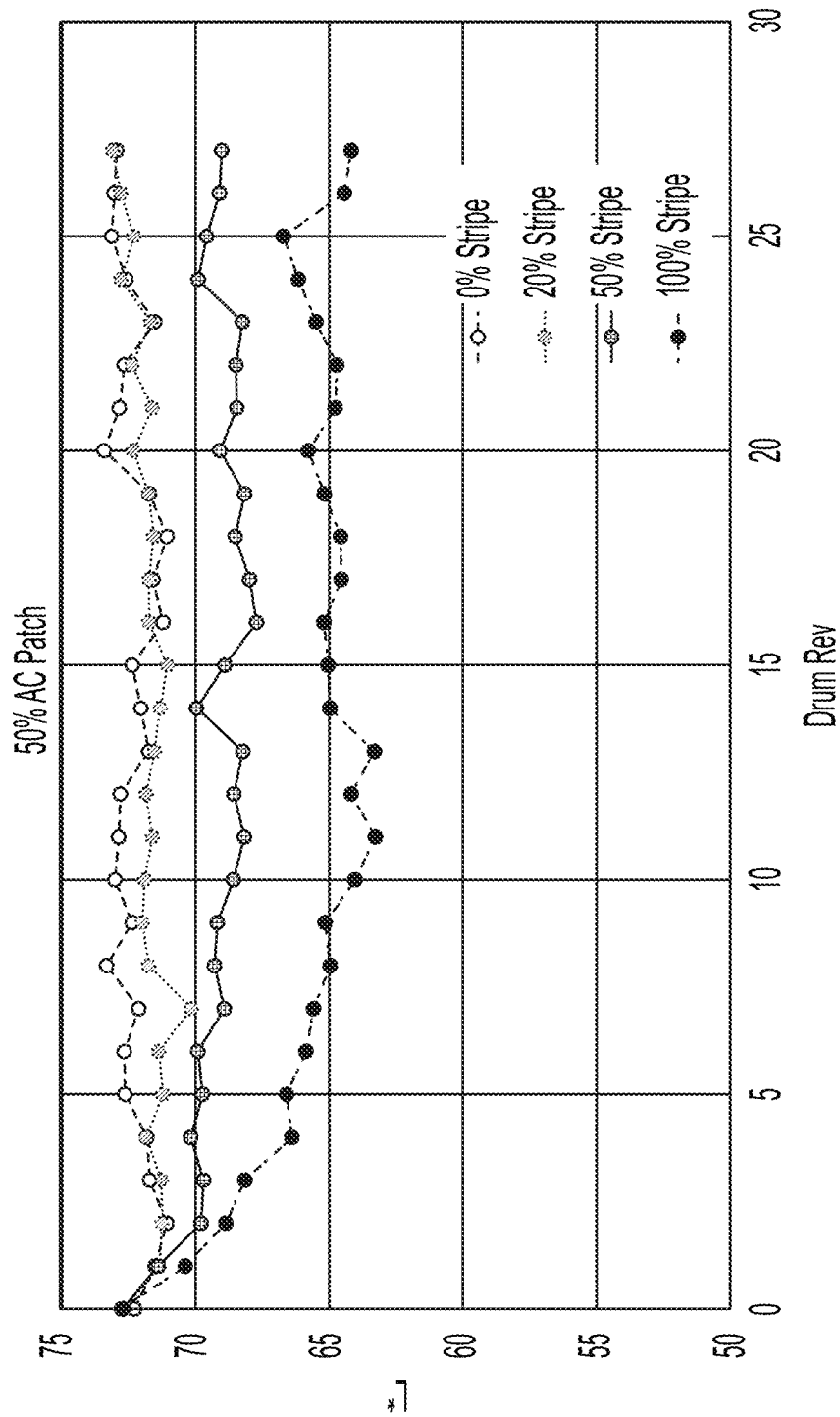
FIG. 9 is a graph illustrating brightness L*variation for 50% TRC patch from exemplary continuous stripes.
Figure 10:
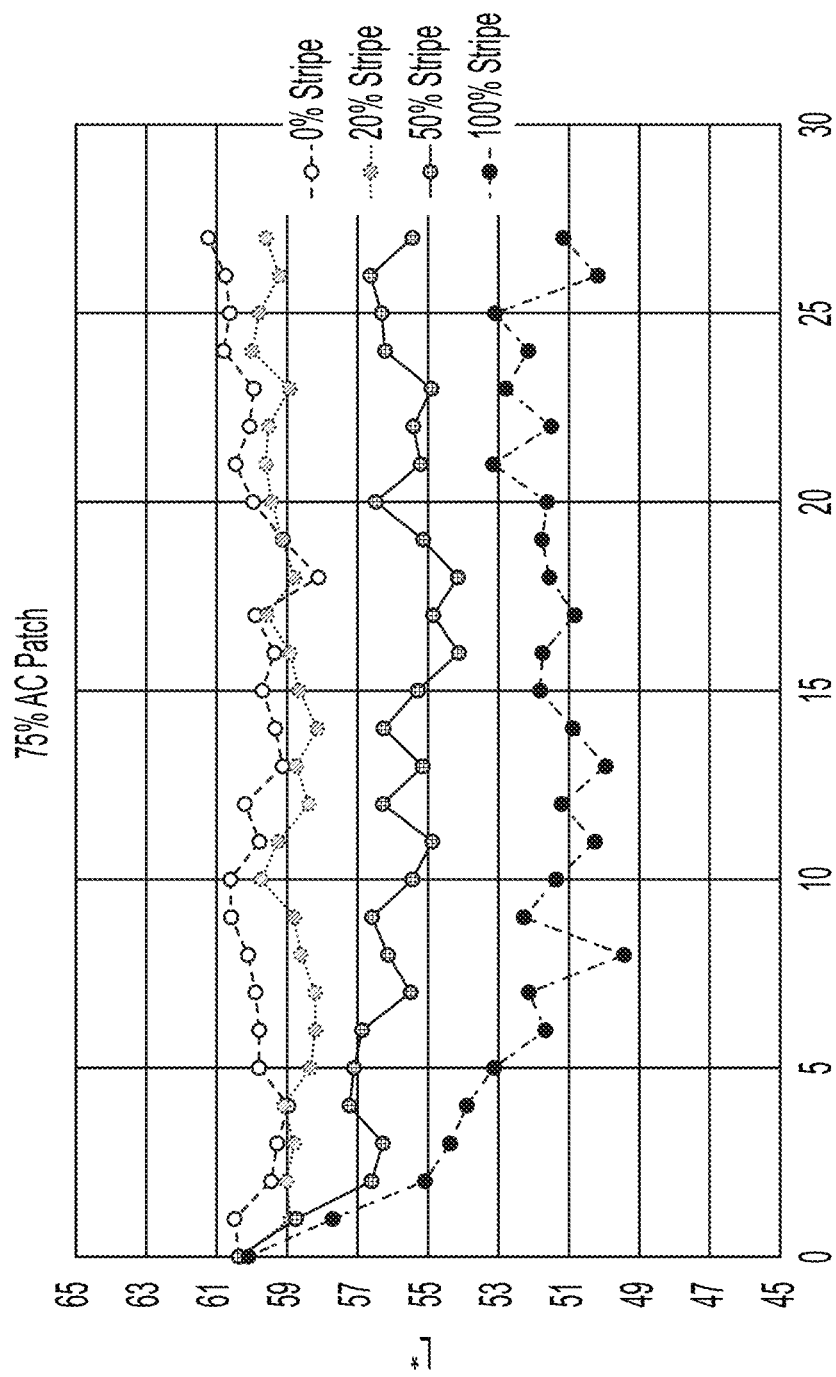
FIG. 10 is a graph illustrating brightness L*variation for 75% TRC patch from exemplary continuous stripes.
Figure 11:
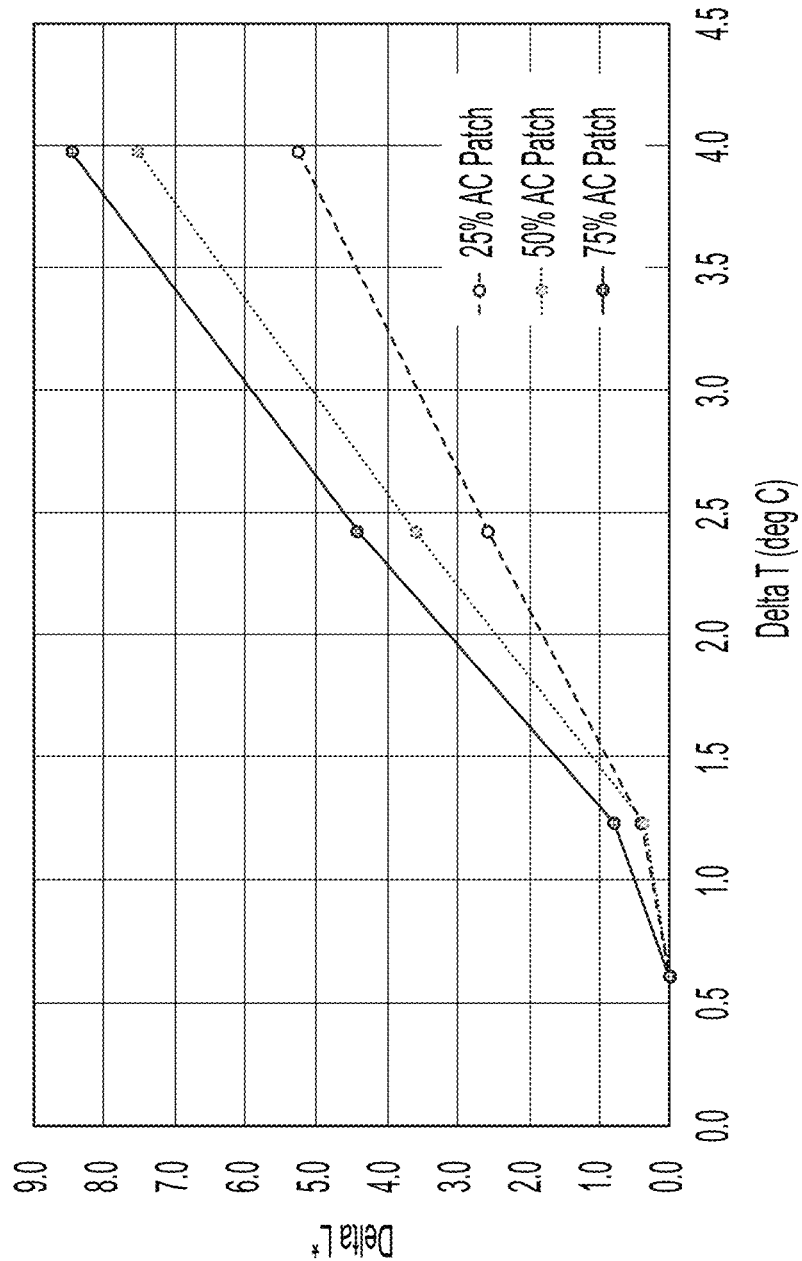
FIG. 11 is a graph illustrating an exemplary change in brightness for change in imaging member surface temperature for different AC patches.

FIG. 6 depicts an exemplary image layout 110 with continuous area coverage stripe 102 (e.g., 0%, 20%, 50%, 100% area coverage stripes) followed by TRC patches 106 that included 0%, 25%, 50%, 75% and 100% patches. The continuous stripe 102 may be imaged, for example over at least one revolution of the imaging member 24. In a subsequent imaging member 24 revolution the temperature sensor 78 (e.g., non-contact thermocouple) measures TRC temperature data, including temperature data, while an inline scanner portion of the sensor may measure brightness L* values. The temperature delta was generated relative to the 0% area coverage patch 106 and can be seen in FIG. 7. L* data was generated for the 25%, 50% and the 75% area coverage patches 106 and the data can be seen in FIGS. 8-10 respectively. It was determined that it took about 10 drum revolutions to reach a steady state blanket temperature. Data was then generated knowing the temperature delta induced by the stripes and the steady-state brightness (L*) change after 10 drum revs that can be seen in FIG. 11. This data may be used to correct subsequent image defects due to thermal ghosting.

Figure 12:
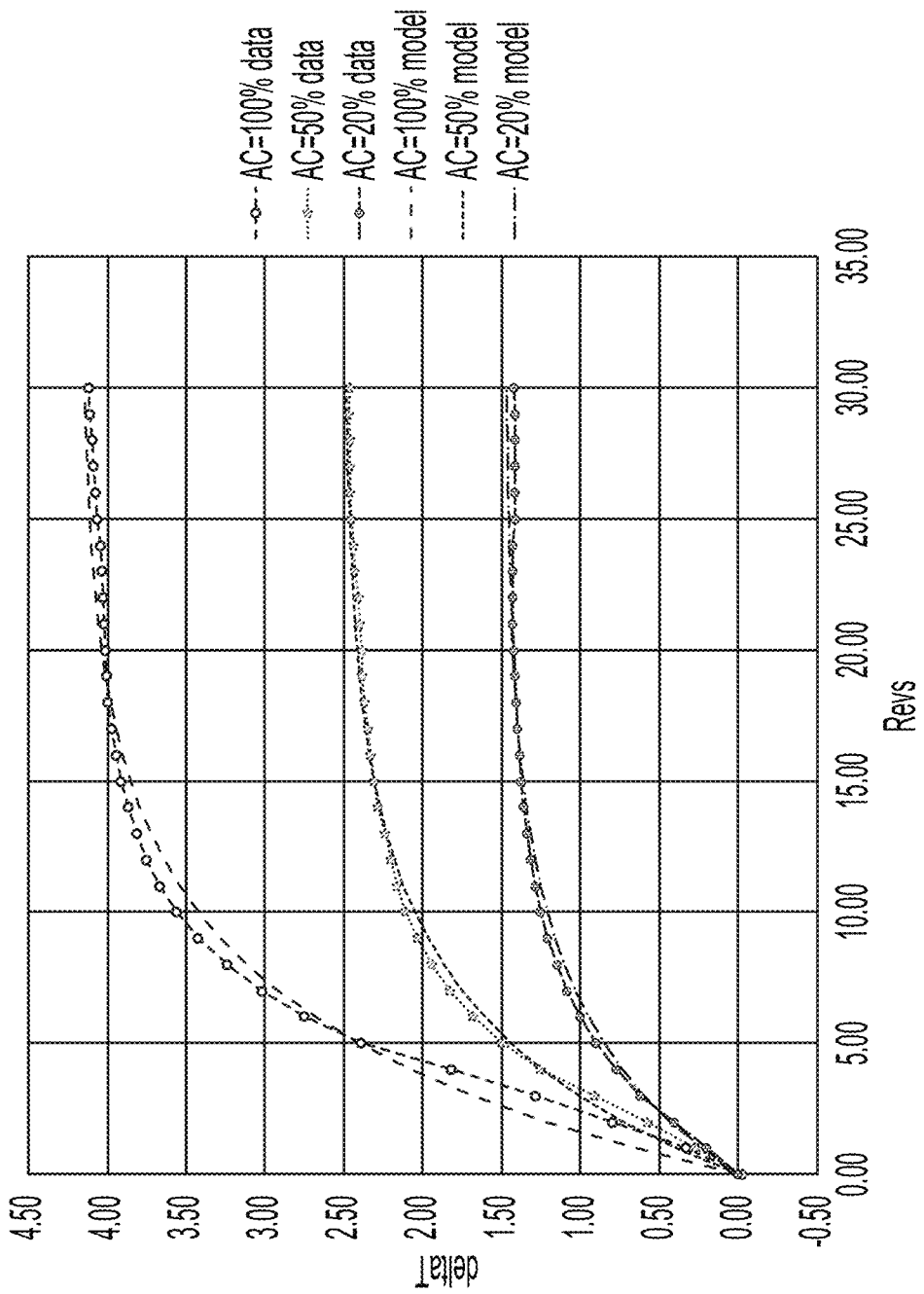
FIG. 12 is a graph of an exemplary thermal model fit to determine $\Delta T_0$ as a function of gray level (g) and time constant $\tau_d$.
Figure 13:
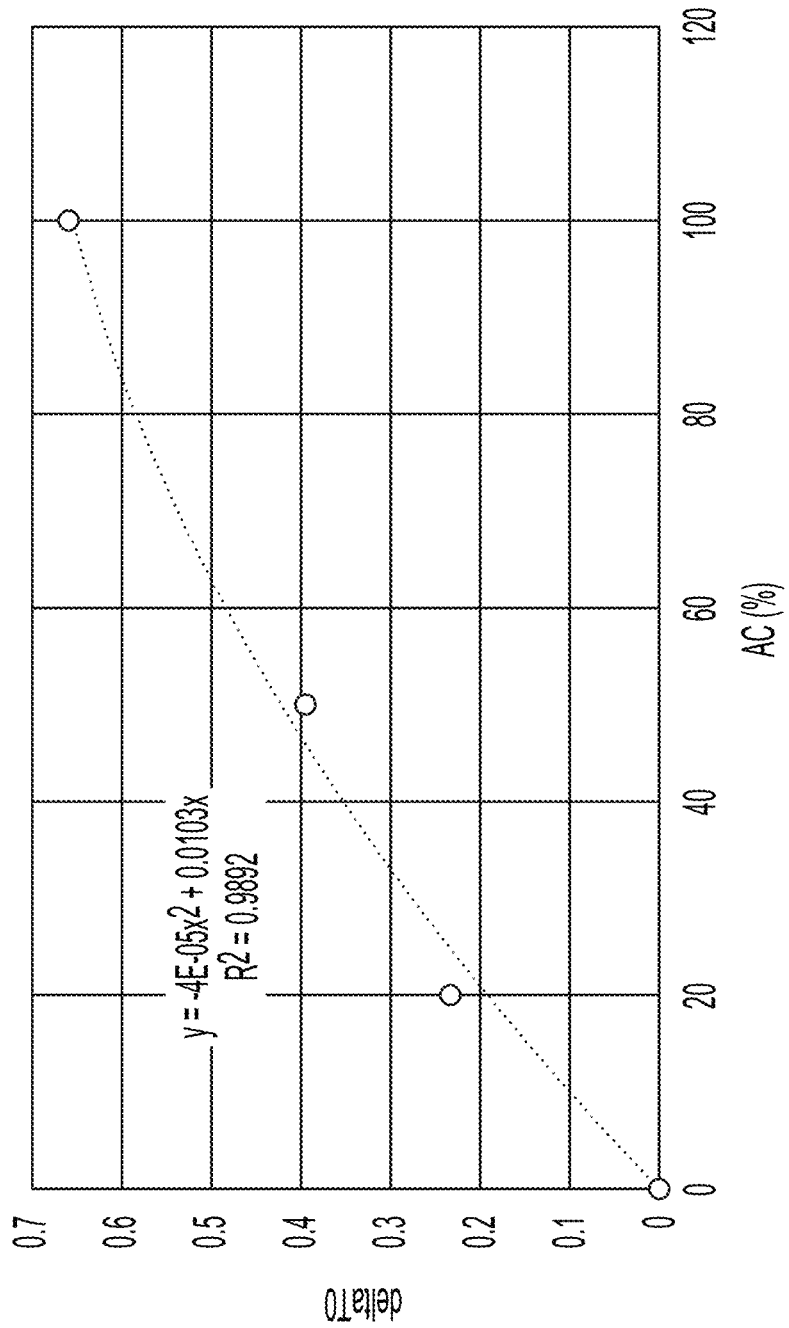
FIG. 13 is a graph illustrating an exemplary $\Delta T_0$ as a function of gray level g.
Figure 14:
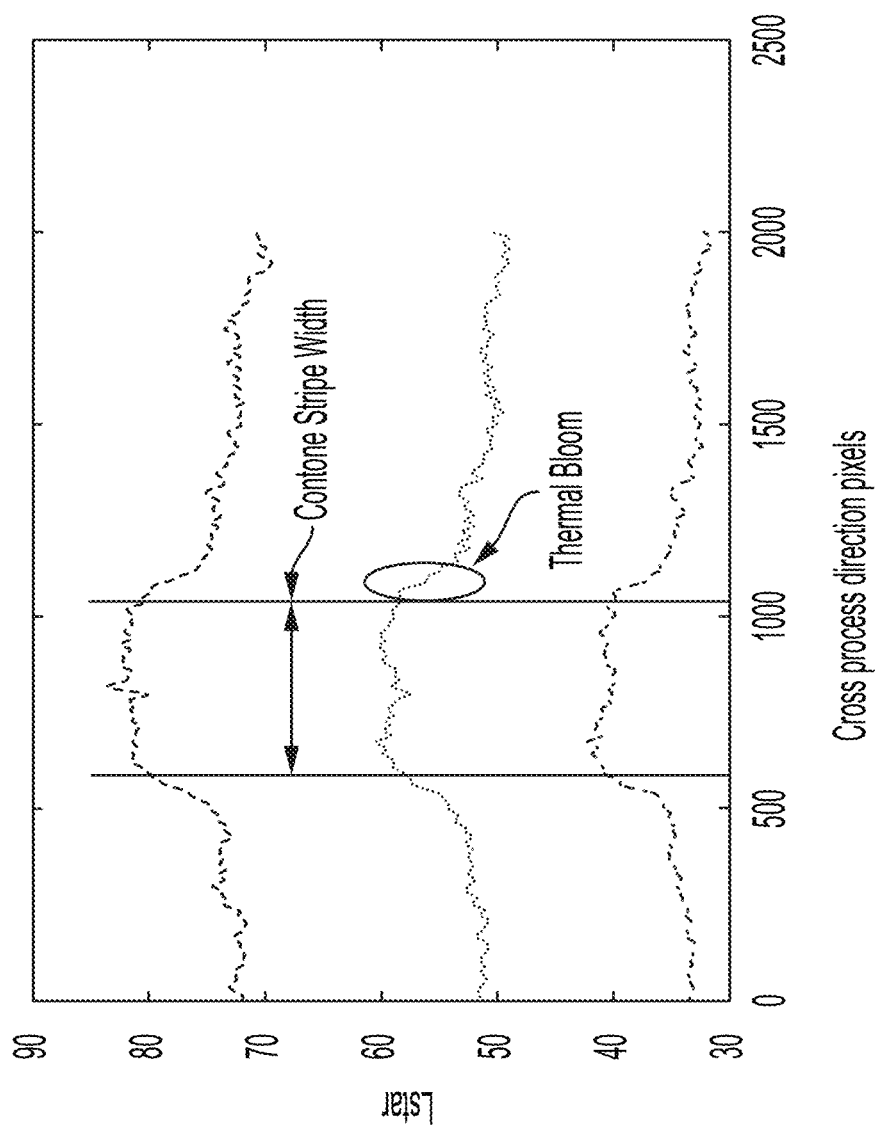
FIG. 14 is a graph showing exemplary lateral thermal blooming from an image target.
Figure 15:
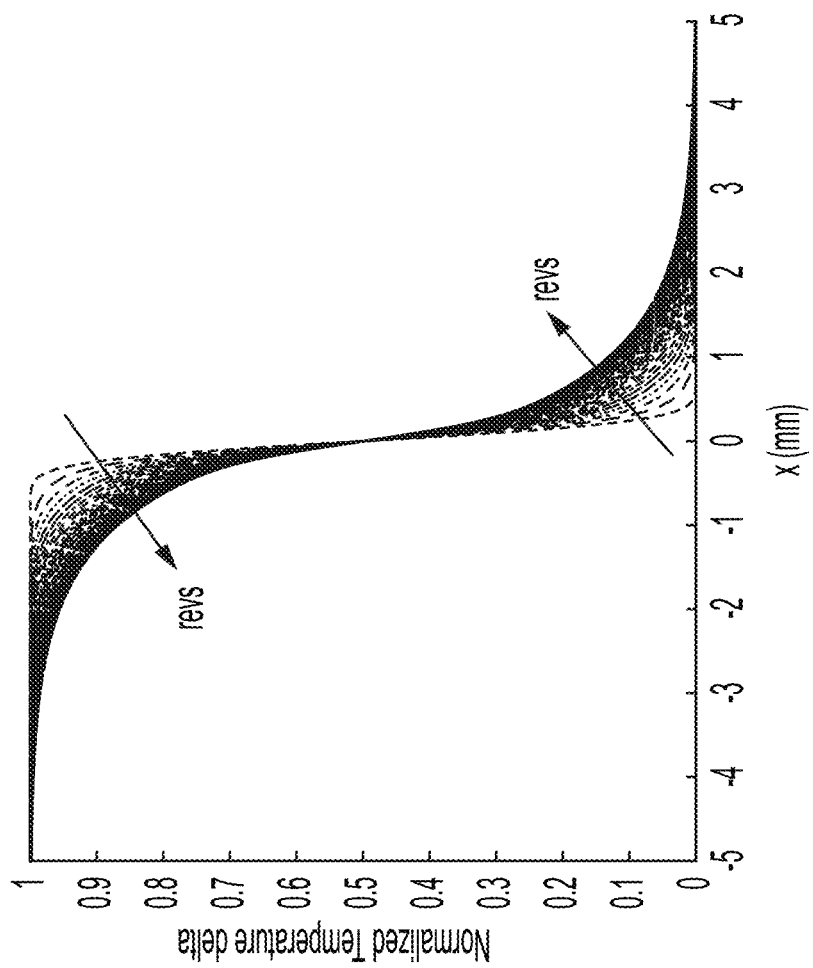
FIG. 15 shows an exemplary simulation of edge diffusion.

FIG. 12 shows, the thermal model fit to data in FIG. 3 to estimate $\Delta T_0$ as a function of gray level (g) and time constant $\tau_d$. Fitting the thermal model, $\tau_d$ is estimated to be 4.85 s and polynomial function $\Delta T_0(g)$ is shown in FIG. 13 to be non-lineal across area coverage in contrast with a linear function as previously assumed. The thermal model may also account for lateral thermal blooming which will also be learned from data. To estimate thermal bloom w the inventors considered the edge between a solid area and background and monitored the lateral thermal diffusion of the edge. FIG. 14 shows lateral thermal blooming, or diffusion of edge, between a solid area and background area by an image target on the imaging member surface. FIG. 15 illustrates an exemplary simulation of the edge diffusion. In accordance with these figures, the inventors estimated w=0.339 mm. Incidentally, the inventors also estimated this from an analytical solution of the diffusion of a semi-infinite solid erf $$\left(\frac{x}{2\sqrt{\alpha t}}\right),$$

which gives an estimate for w of $w=\sqrt{\alpha_s t_d}$, where $\alpha_s$ is the diffusivity of the fluorosilicone surface layer of the imaging member surface. Based on the measured thermal bloom, w is considered reasonably stable, yet may be updated and verified as needed.

Referring back to the flowchart shown in FIG. 4, operation of the method proceeds to Step S120, where the controller 60 creates a temperature map of the reimageable surface based on the determined and estimated temperature increases at the reimageable surface discrete coordinates. For example, the temperature map may include the estimated $\Delta T(n,x_d,y_d)$ for imaging member surface locations $(x_d,y_d)$ at a current drum rotation ID. The temperature map is thus associated with the measured temperatures by the temperature sensor and the learned or adjusted thermal model as discussed by example above, and may be stored in data storage device 84.

Figure 16:
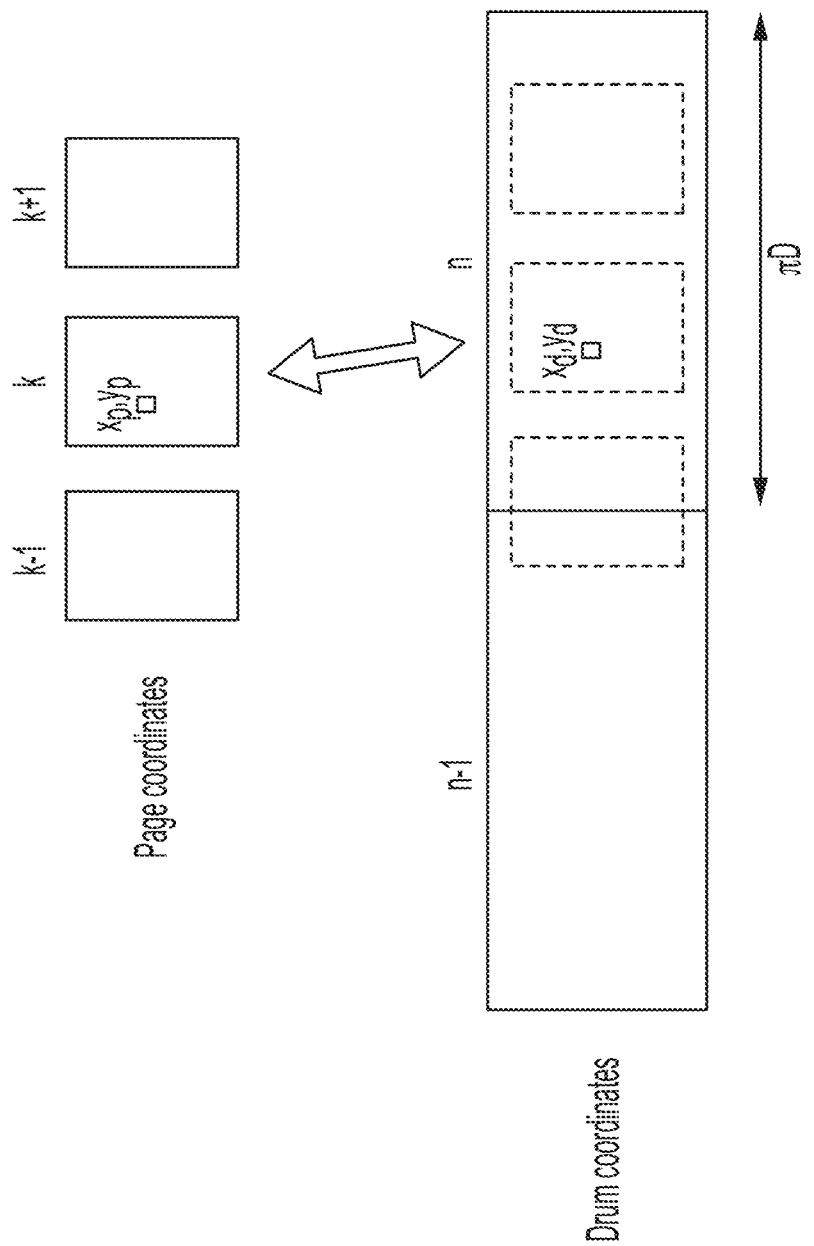
FIG. 16 illustrates an exemplary mapping between coordinates of digital image pages and an imaging member surface.

Operation of the method proceeds to Step S130, where the controller/processor aligns information of the current digital image with the temperature map of the reimageable surface where the current digital image will be rendered. This alignment requires knowledge of where the current digital image will be rendered on the imaging member surface 26, as well understood by a skilled artisan FIG. 16 illustrates an exemplary mapping between digital image pages and imaging member surface 26 coordinates. The current digital image information includes a pixel-wise gray level of the current digital image, and may be stored in data storage device 84. The gray level may be contone gray level. Accordingly, the controller/processor maps the gray level of images in a buffer of images representing, for example, images of a print job including a current digital image onto the imaging member surface, $g_d(n,x,y)$, where n is the drum rotation ID (>0). It should be noted that each pixel location $(x_p,y_p)$ on a page k uniquely maps to a location $(x_d,y_d)$ on the drum at rotation n, and vice versa (FIG. 16).

Operation of the method proceeds to Step S140, where the controller/processor determines a corrected current digital image including a gray level modification of the current digital image based on the pixel-wise gray level of the current digital image and the aligned temperature map to decrease marking material density at reimageable surface discrete coordinates that are warmer than the background area and prevent ghosting of the previously imaged prior digital image on a printing of the current digital image. In other words, the corrected current digital image may be generated by adjusting the gray levels of the current image in-line with the thermal stress areas, plus, if desired, gray level modification adjustments for lateral diffusion.

The controller 60 and/or processors 82 thereof can add gray level modifications to the current digital image to arrive at the corrected current digital image from the measured temperature and TRC data. Such ghosting correction gray level modifications may be determined based on the following: $gl_{out}=gl_{in}+\Delta gl$; $\Delta gl=f(gl_{in}$, blanket temp), where $gl_{in}$ is the original input gray level of a contone image for any particular image pixel, $gl_{out}$ is the corrected gray level of a contone image for that particular image pixel, and $\Delta gl$ is the gray level correction for correction for that particular image pixel due to thermal ghosting artifacts. Lateral thermal diffusion may be accounted for as discussed above or by a predefined distance (e.g., an empirical determination that lateral thermal diffusion impacts ~3.5 mm of the correction at each edge). In examples, transition between stress and non-stress regions of the current digital image at each edge may be determined based on the measured lateral thermal blooming, simulation of diffusion and estimated width of thermal bloom w as discussed above, and estimated as linear.

The gray level modification may be a contone gray level modification. Further, the gray level modification may be determined via a correction lookup table (LUT). The LUT is a two dimensional table, with gray levels $(g_i)$ varying along the rows, and temperature rise $(\Delta T_j)$ varying along the columns. Each ij entry of the LUT is the gray level correction $(\Delta g_{ij})$ that needs to be applied for gray level $g_i$ and temperature delta $\Delta T_j$. The LUT may be developed by the learning approach, for example, via imaging and measuring the continuous strips 102 and TRC patches 106, determining the a drum temperature rise $\Delta T$ at a location one drum revolution from the source patch using the temperature sensor 78, and calculating the gray level correction needed at $\Delta T>0$ to maintain the deltaE at $\Delta T=0$. The correction LUT or equivalent parameterized equations may be used to determine a pixel-wise gray level correction for the current digital image that is dependent on the input gray level and the temperature of the blanket where the imaged pixels will be rendered.

As an example of step S140, K represents the number of pages in the buffer, and $g_p(k,x_p,y_p)$ represents the corrected contone gray level for page k (=1 . . . K), at pixel location $x_p$, $y_p$. Given an engine response curve of the form deltaE=f $(g,\Delta T)$, the controller/processor may determine gray level correction using parameterized equations:

$$\Delta g_p(k, x_p, y_p) = -\frac{\frac{\partial f}{\partial \Delta T}|_{g=g_p^0,\Delta T=0}}{\frac{\partial f}{\partial g}|_{g=g_p^0,\Delta T=0}} \Delta T(n-1, x_d, y_d) \quad (2)$$

$$g_p(k, x_p, y_p) = g_p^0(k, x_p, y_p) + \Delta g_p(k, x_p, y_p)$$

Operation of the method proceeds to Steps S150, where the image forming device (e.g., dampening station 12, optical patterning subsystem 16, inking apparatus 18) renders the corrected current digital image on the reimageable surface 26 for a printing by the ink-based digital image forming device on print substrate 34. Due to temperature differences on the imaging member surface caused by prior printings, the printing of the rendered corrected current digital image that is transferred from the imaging member surface to print substrate 34 appears not as the corrected current digital image, but as the current digital image. Operation may cease at Step S160, or may continue by repeating back to Step S110, for additional printing.

The exemplary depicted sequence of executable method steps represents one example of a corresponding sequence of acts for implementing the functions described in the steps. The exemplary depicted steps may be executed in any reasonable order to carry into effect the objectives of the disclosed embodiments. No particular order to the disclosed steps of the method is necessarily implied by the depiction in FIG. 4, and the accompanying description, except where any particular method step is reasonably considered to be a necessary precondition to execution of any other method step. Individual method steps may be carried out in sequence or in parallel in simultaneous or near simultaneous timing. Additionally, not all of the depicted and described method steps need to be included in any particular scheme according to disclosure.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

The instructions may include, for example, controller-executable instructions and data which cause the controller 60 to perform a certain function or group of functions. Controller-executable instructions may include program modules that are executed by the controller in stand-alone or network environments. Generally, program modules include routines, programs, objects, components, and data structures, and the like that perform particular tasks or implement particular abstract data types. Controller-executable instructions, associated data structures, and program modules represent examples of the program code means for executing steps of the methods disclosed herein. The particular sequence of such executable instructions or associated data structures represents examples of corresponding acts for implementing the functions described therein.

Those skilled in the art will appreciate that other embodiments of the disclosed subject matter may be practiced with many types of image forming elements common to offset inking system in many different configurations. For example, although digital lithographic systems and methods are shown in the discussed embodiments, the examples may apply to analog image forming systems and methods, including analog offset inking systems and methods. It should be understood that these are non-limiting examples of the variations that may be undertaken according to the disclosed schemes. In other words, no particular limiting configuration is to be implied from the above description and the accompanying drawings.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art.

What is claimed is:

1. A method for mitigating thermal ghosting on a printed image with an ink-based image forming device having a rotatable imaging member with a reimageable surface in an environment having an ambient temperature, the method comprising:
   a) after an imaging of a prior image on the reimageable surface, measuring temperatures of the reimageable surface with a temperature sensor adjacent the reimageable surface, the temperatures being affected by stress induced by the imaging;
   b) aligning information of a current image with a temperature map of the reimageable surface where the current image will be rendered, the information including a pixel-wise gray level of the current image, the temperature map associated with the measured temperatures by the temperature sensor;
   c) determining a corrected current image including a gray level modification of the current image based on the pixel-wise gray level of the current image and the temperature map to decrease marking material density at reimageable surface discrete coordinates that are warmer than a reference temperature and prevent ghosting of the prior image on a printing of the current image; and
   d) rendering the corrected current image on the reimageable surface for a printing by the ink-based image forming device, the printing of the rendered corrected current image appearing not as the corrected current image, but as the current image.

2. The method of claim 1, further comprising before step b), creating the temperature map of the reimageable surface based on the measured temperature increases on the reimageable surface caused by the imaging of the prior image on the reimageable surface.

3. The method of claim 1, further comprising before step b), storing the information of the current image.

4. The method of claim 1, the step c) further comprising determining the gray level modification of the current image via a correction LUT.

5. The method of claim 1, wherein the pixel-wise gray level of the current image is a pixel-wise contone gray level of the current image, and the corrected current image includes a contone gray level modification of the current image.

6. The method of claim 1, the step c) further comprising determining the corrected current image with a contone image modifier that makes the current image lighter at reimageable surface discrete coordinates that are warmer than the background area.

7. The method of claim 1, the step c) further comprising determining the corrected current image including the gray level modification of the current image further adjusted for lateral thermal diffusion.

8. The method of claim 1, wherein the rotatable imaging member includes a conformable blanket around a central drum with the conformable blanket including the reimageable surface, and the measured temperature increases are based on previous imaging rendered on the reimageable surface, temporal 3D thermal conduction/diffusion, a temperature of the central drum chilling system, and the ambient temperature.

9. The method of claim 1, step a) further comprising:
   d) determining temperature increases above a reference temperature for a plurality of reimageable surface discrete coordinates on the reimageable surface with the temperature sensor, the reference temperature associated with a temperature at a background area of the reimageable surface different than where the prior image was imaged on the reimageable surface, the temperature increases for the plurality of reimageable surface discrete coordinates resulting from imaging of the prior image on the reimageable surface; and
   e) creating the temperature map of the reimageable surface based on the determined temperature increases at the plurality of reimageable surface discrete coordinates.

10. The method of claim 9, wherein the rotatable imaging member includes a conformable blanket around a central drum with the conformable blanket including the reimageable surface, and the step d) determining temperature increases above the reference temperature includes measuring the conformable blanket at the plurality of reimageable surface discrete coordinates on the reimageable surface according to the equation $$\Delta T(n, x_d, y_d) = PSF\big([\Delta T(n-1, x_d, y_d)e^{-t_d/\tau_d} + \Delta T_0(g_d(n, x_d, y_d))]; w\big),$$

where $\Delta T(n, x_d, y_d)$ is the temperature rise at location $(x_d, y_d)$ on the reimageable surface at drum rotation ID n, PSF is a gaussian point spread function used to account for lateral thermal diffusion at the reimageable surface, e is Euler's number (e=2.718281828 . . . ), $t_d$ is the time for one drum rotation, $\tau_d$ is the time constant of temperature decay on the reimageable surface, $\Delta T_0(g_d)$ is the expected temperature rise immediately after imaging a gray scale image of level $g_d$ at location $(x_d,y_d)$ on the reimageable surface at drum rotation n, and w is the width of the gaussian PSF.

11. The method of claim 1, wherein the rotatable imaging member includes a conformable blanket around a central drum with the conformable blanket including the reimageable surface, and the gray level modification is determined according to the equation $$\Delta g_p(k, x_p, y_p) = -\frac{\frac{\partial f}{\partial \Delta T}\big|_{g=g_p^0,\Delta T=0}}{\frac{\partial f}{\partial g}\big|_{g=g_p^0,\Delta T=0}} \Delta T(n-1, x_d, y_d)$$

$$g_p(k, x_p, y_p) = g_p^0(k, x_p, y_p) + \Delta g_p(k, x_p, y_p)$$

for an engine response curve of the form deltaE=f(g,ΔT) where $g_p^0$ is an original uncorrected contone gray level, $g_p(k,x_p,y_p)$ is a corrected contone gray level for page k (=1 . . . K), at pixel location $x_p$, $y_p$, and each pixel location $(x_p,y_p)$ on a page k uniquely maps to a location $(x_d,y_d)$ on the reimageable surface at drum rotation n.

12. A non-transitory computer-readable medium having stored thereon computer executable instructions that, when executed on a controller of an image forming device, cause the controller to perform the method of claim 1.

13. An image formation apparatus for mitigating thermal ghosting on a printed image with an ink-based image forming device having a rotatable imaging member with a reimageable surface in an environment having an ambient temperature, comprising:
   a controller;
   a temperature sensor adjacent the reimageable surface; and
   a storage device coupled to the controller, the storage device having instructions operative on the controller to
      a) measure temperatures of the reimageable surface with the temperature sensor adjacent the reimageable surface after an imaging of a prior image on the reimageable surface, the temperatures being affected by stress induced by the imaging;
      b) align information of a current image with the temperature map of the reimageable surface where the current image will be rendered, the information including a pixel-wise gray level of the current image, the temperature map associated with the measured temperatures by the temperature sensor;
      c) determine a corrected current image including a gray level modification of the current image based on the pixel-wise gray level of the current image and the aligned temperature map to decrease marking material density at reimageable surface discrete coordinates that are warmer than the background area and prevent ghosting of the prior image on a printing of the current image; and
      d) instruct the ink-based image forming device to render the corrected current image on the reimageable surface for a printing by the ink-based image forming device, the printing of the rendered corrected current image appearing not as the corrected current image, but as the current image.

14. The image formation apparatus of claim 13, the storage device having further instructions operative on the controller to create the temperature map of the reimageable surface based on the measured temperature increases on the reimageable surface caused by the imaging of the prior image on the reimageable surface.

15. The image formation apparatus of claim 13, the storage device having further instructions operative on the controller to:
      d) determine temperature increases above a reference temperature for a plurality of reimageable surface discrete coordinates on the reimageable surface with the temperature sensor, the reference temperature associated with a temperature at a background area of the reimageable surface different than where the prior image was imaged on the reimageable surface, the temperature increases for the plurality of reimageable surface discrete coordinates resulting from imaging of the prior image on the reimageable surface; and
      e) create the temperature map of the reimageable surface based on the determined temperature increases at the plurality of reimageable surface discrete coordinates.

16. The image formation apparatus of claim 13, the storage device storing the information of the current image and the corrected current image.

17. The image formation apparatus of claim 13, the storage device storing a lookup table having corrective information, and the controller determines the gray level modification of the current image via the corrective information.

18. The image formation apparatus of claim 13, wherein the controller determines the corrected current image with a contone image modifier that makes the current image lighter at reimageable surface discrete coordinates that are warmer than the background area.

19. The image formation apparatus of claim 13, wherein the controller determines the corrected current image including the gray level modification of the current image further adjusted for lateral thermal diffusion.

20. A method for mitigating thermal ghosting on a printed image with an ink-based image forming device having a rotatable imaging member with a reimageable surface in an environment having an ambient temperature, the method comprising:
      a) creating a temperature map of the reimageable surface based on measured temperature increases above a reference temperature for a plurality of reimageable surface discrete coordinates on the reimageable surface, the reference temperature associated with a temperature setpoint of a central drum chilling system, the temperature increases for the plurality of reimageable surface discrete coordinates resulting from imaging of prior images on the reimageable surface;
      b) aligning information of a current image with the temperature map of the reimageable surface where the current image will be rendered, the information including a pixel-wise gray level of the current image;
      c) determining a corrected current image including a gray level modification of the current image based on the pixel-wise gray level of the current image and the aligned temperature map to decrease marking material density at reimageable surface discrete coordinates that are warmer than the background area and prevent ghosting of the prior images on a printing of the current image; and
      d) rendering the corrected current image on the reimageable surface for a printing by the ink-based image forming device, the printing of the rendered corrected current image appearing not as the corrected current image, but as the current image.

\* \* \* \* \*